United States Patent
Lin et al.

(10) Patent No.: US 10,177,010 B2
(45) Date of Patent: Jan. 8, 2019

(54) SEMICONDUCTOR DEVICE AND METHOD OF BALANCING SURFACES OF AN EMBEDDED PCB UNIT WITH A DUMMY COPPER PATTERN

(71) Applicant: STATS ChipPAC Pte. Ltd., Singapore (SG)

(72) Inventors: Yaojian Lin, Singapore (SG); Kang Chen, Singapore (SG); Hin Hwa Goh, Singapore (SG); Il Kwon Shim, Singapore (SG)

(73) Assignee: STATS ChipPAC Pte. Ltd. (SG)

( * ) Notice: Subject to any disclaimer, the term of this patent is extended or adjusted under 35 U.S.C. 154(b) by 27 days.

(21) Appl. No.: 15/235,008

(22) Filed: Aug. 11, 2016

(65) Prior Publication Data

US 2016/0351419 A1 Dec. 1, 2016

Related U.S. Application Data

(63) Continuation of application No. 14/329,464, filed on Jul. 11, 2014, now Pat. No. 9,449,943.

(Continued)

(51) Int. Cl.
*H01L 21/48* (2006.01)
*H01L 21/56* (2006.01)
(Continued)

(52) U.S. Cl.
CPC .......... *H01L 21/485* (2013.01); *H01L 21/486* (2013.01); *H01L 21/4853* (2013.01); *H01L 21/561* (2013.01); *H01L 21/568* (2013.01); *H01L 23/13* (2013.01); *H01L 23/49816* (2013.01); *H01L 23/49827* (2013.01); *H01L 23/49833* (2013.01); *H01L 23/49838* (2013.01); *H01L 23/5385* (2013.01); (Continued)

(58) Field of Classification Search
CPC ........ H01L 21/48; H01L 21/56; H01L 23/498
USPC .......................... 257/774, 734; 438/114, 465
See application file for complete search history.

(56) References Cited

U.S. PATENT DOCUMENTS 6,080,979 A * 6/2000 Sklebitz ............ H01L 27/14601
250/208.1
6,727,567 B2 4/2004 Bastek et al.
(Continued)

FOREIGN PATENT DOCUMENTS

JP H08-051258 2/1996

*Primary Examiner* — Sheng Zhu
(74) *Attorney, Agent, or Firm* — Brian M. Kaufman; Robert D. Atkins; Patent Law Group: Atkins and Associates, P.C.

(57) ABSTRACT

A semiconductor device has a substrate. A conductive via is formed through the substrate. A plurality of first contact pads is formed over a first surface of the substrate. A plurality of second contact pads is formed over a second surface of the substrate. A dummy pattern is formed over the second surface of the substrate. An indentation is formed in a sidewall of the substrate. An opening is formed through the substrate. An encapsulant is deposited in the opening. An insulating layer is formed over second surface of the substrate. A dummy opening is formed in the insulating layer. A semiconductor die is disposed adjacent to the substrate. An encapsulant is deposited over the semiconductor die and substrate. The first surface of the substrate includes a width that is greater than a width of the second surface of the substrate.

17 Claims, 25 Drawing Sheets

Related U.S. Application Data

(60) Provisional application No. 61/897,176, filed on Oct. 29, 2013.

(51) Int. Cl.
    *H01L 23/498*     (2006.01)
    *H01L 23/00*     (2006.01)
    *H01L 23/13*     (2006.01)
    *H01L 23/538*     (2006.01)

(52) U.S. Cl.
CPC ...... *H01L 23/5386* (2013.01); *H01L 23/5389* (2013.01); *H01L 23/562* (2013.01); *H01L 24/19* (2013.01); *H01L 24/20* (2013.01); *H01L 24/96* (2013.01); *H01L 24/97* (2013.01); *H01L 2224/04105* (2013.01); *H01L 2224/12105* (2013.01); *H01L 2224/24155* (2013.01); *H01L 2224/97* (2013.01); *H01L 2225/107* (2013.01); *H01L 2225/1035* (2013.01); *H01L 2225/1041* (2013.01); *H01L 2225/1058* (2013.01); *H01L 2924/01322* (2013.01); *H01L 2924/12041* (2013.01); *H01L 2924/12042* (2013.01); *H01L 2924/13091* (2013.01); *H01L 2924/181* (2013.01); *H01L 2924/3511* (2013.01)

(56) References Cited

U.S. PATENT DOCUMENTS

| | | | |
|---|---|---|---|
| 7,015,069 B2 * | 3/2006 | Takahashi | H01L 21/561 257/E21.504 |
| 2007/0096307 A1 * | 5/2007 | Murai | H01L 23/3121 257/734 |
| 2007/0296062 A1 | 12/2007 | Chan et al. | |
| 2008/0012140 A1 * | 1/2008 | Tsukano | H01L 21/4846 257/758 |
| 2008/0194058 A1 | 8/2008 | Kwon et al. | |
| 2009/0096079 A1 * | 4/2009 | Park | H01L 23/49816 257/690 |
| 2009/0134497 A1 * | 5/2009 | Barth | H01L 21/76898 257/621 |
| 2009/0163020 A1 * | 6/2009 | Ryu | H01L 21/76816 438/627 |
| 2009/0166892 A1 | 7/2009 | Lee | |
| 2013/0182401 A1 * | 7/2013 | Furutani | H05K 1/0296 361/782 |

* cited by examiner

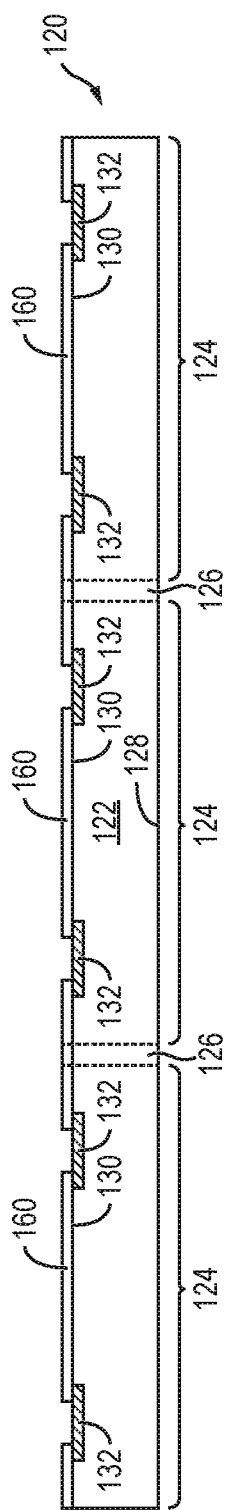
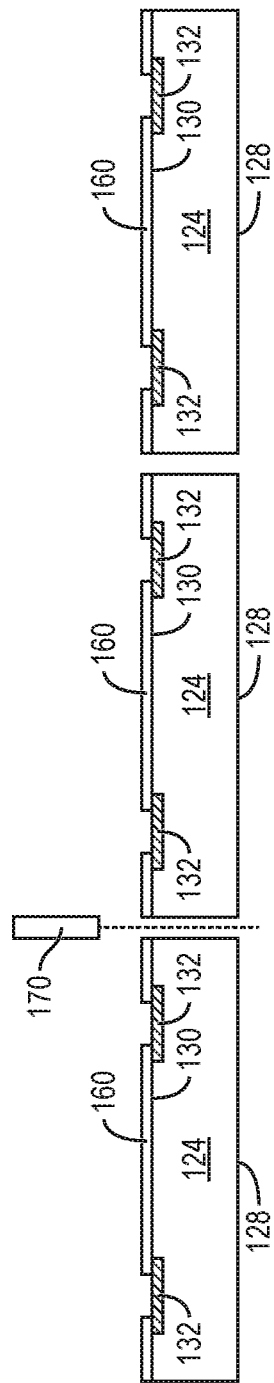
FIG. 2d
FIG. 2e

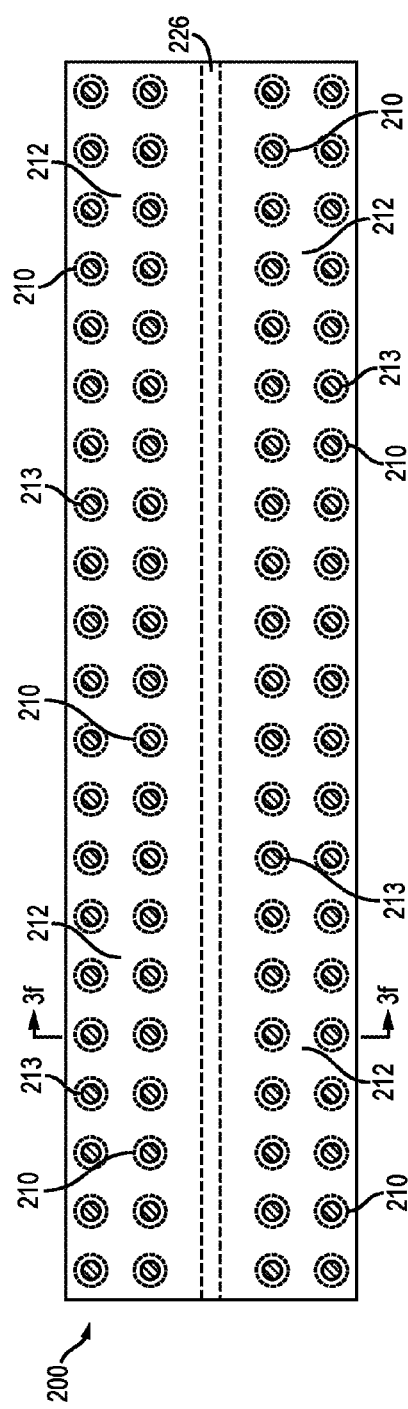
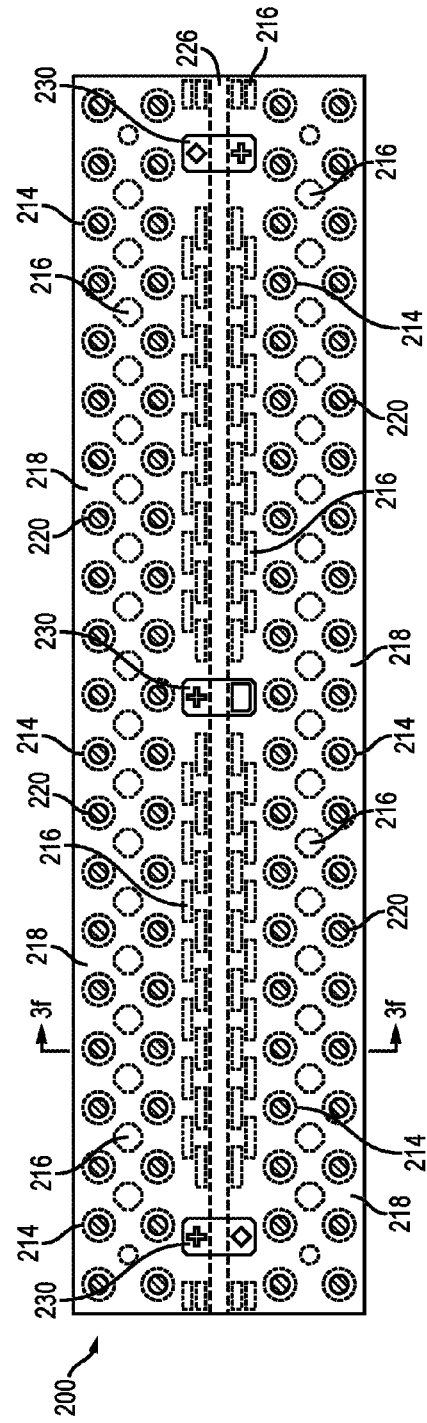

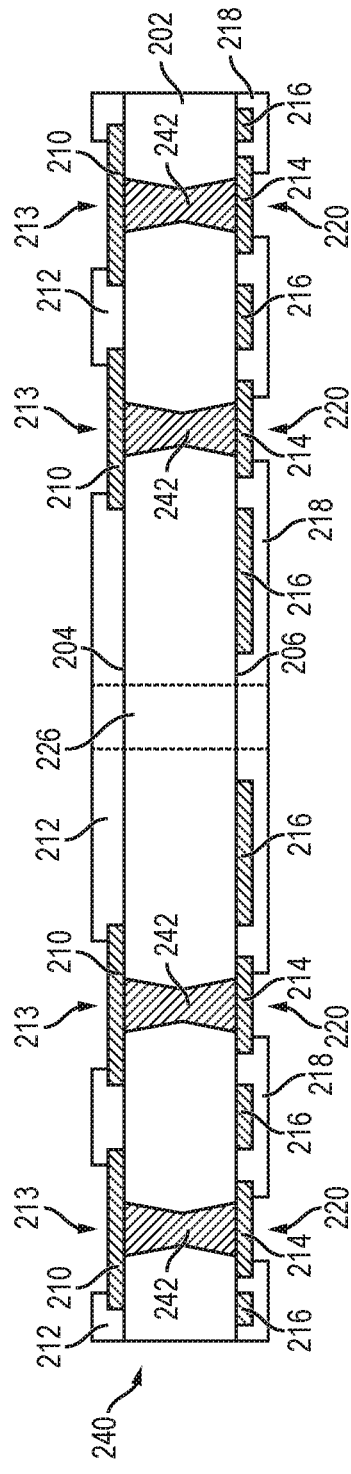
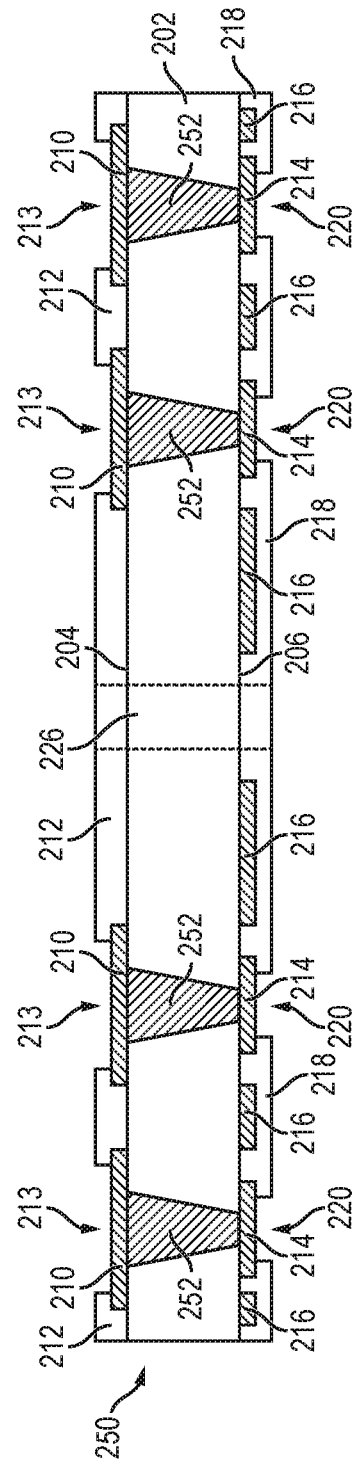

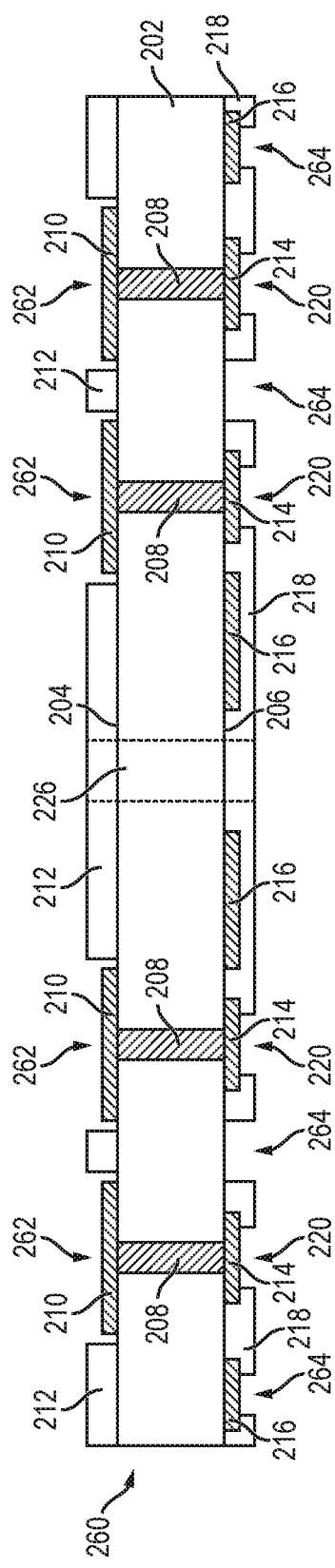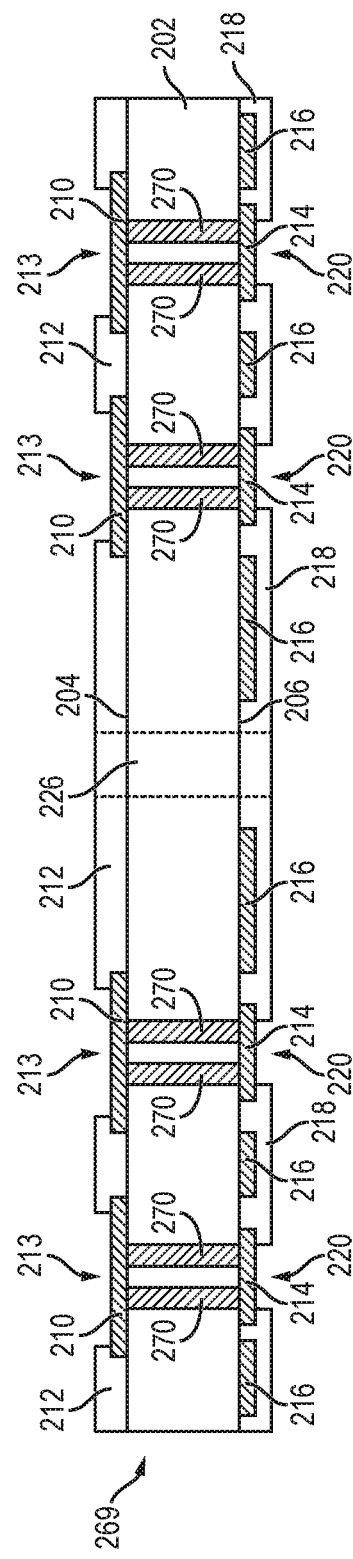

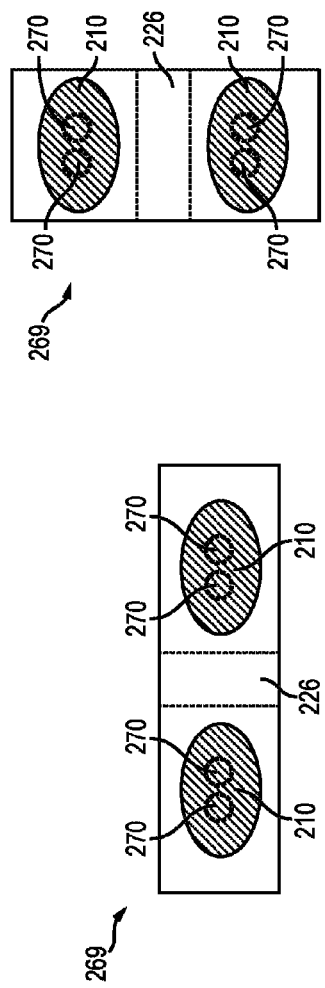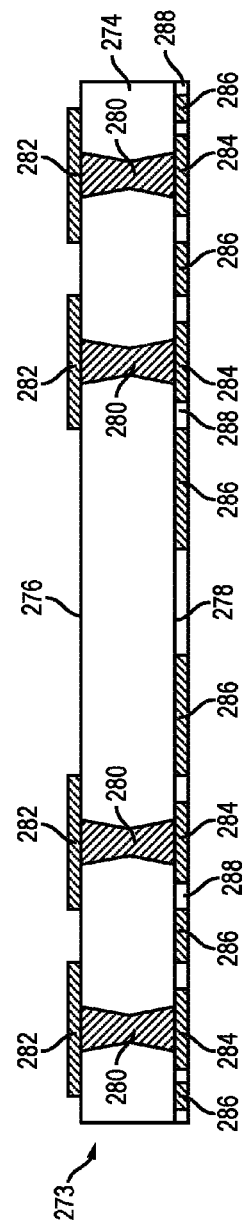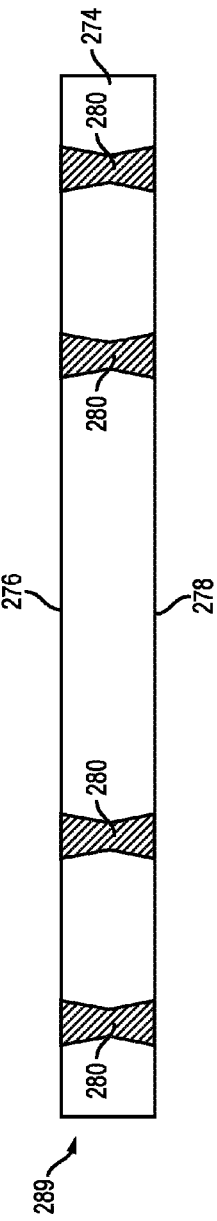

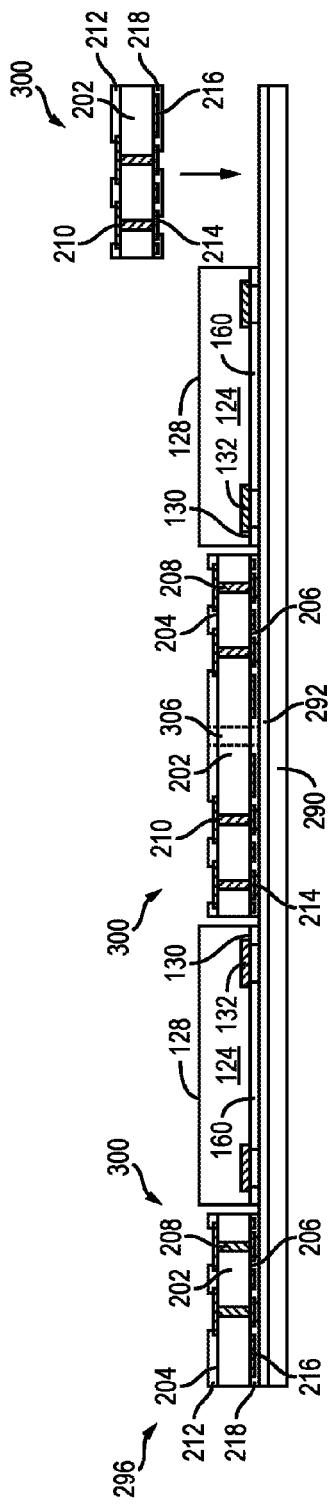
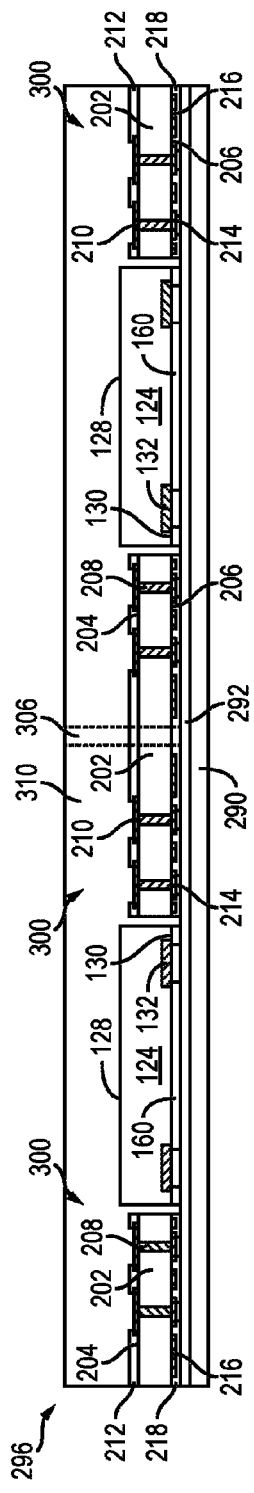
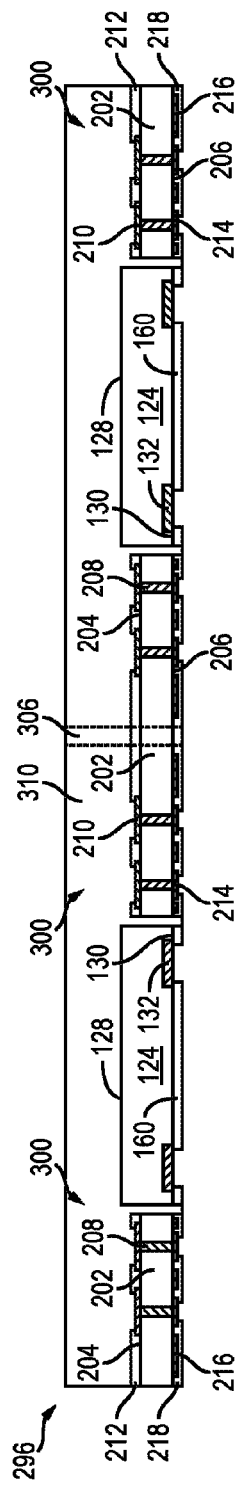
FIG. 5a
FIG. 5c
FIG. 5d

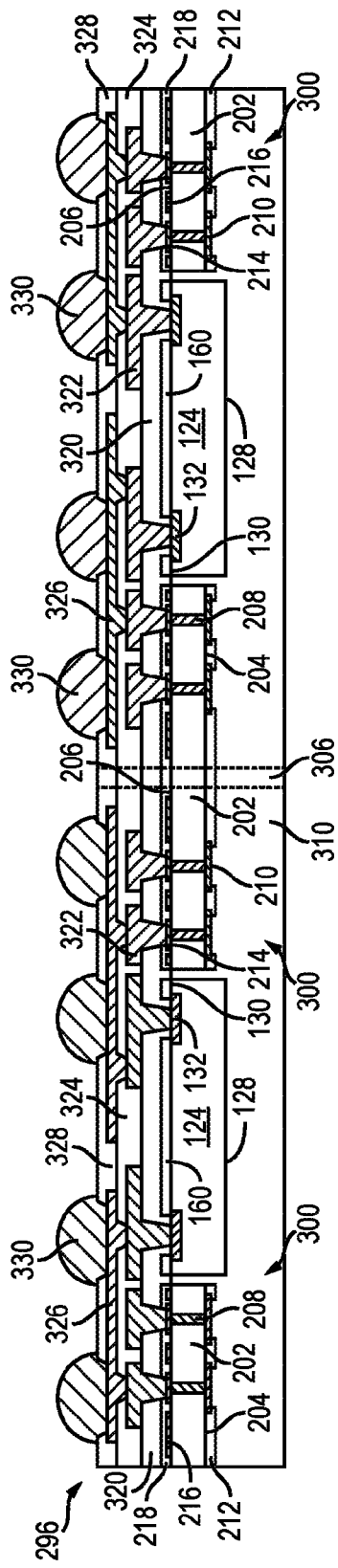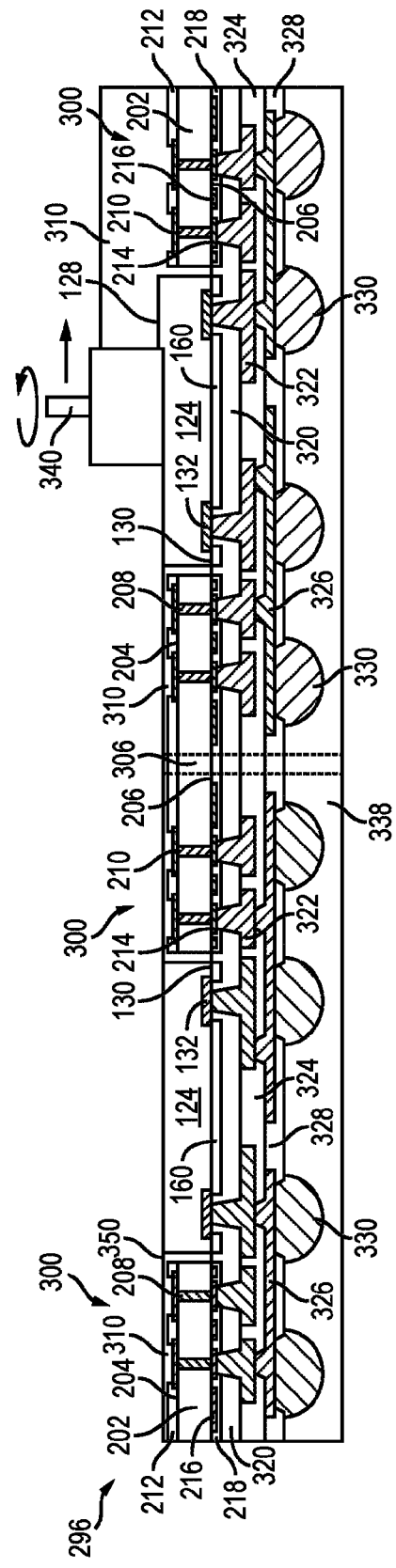

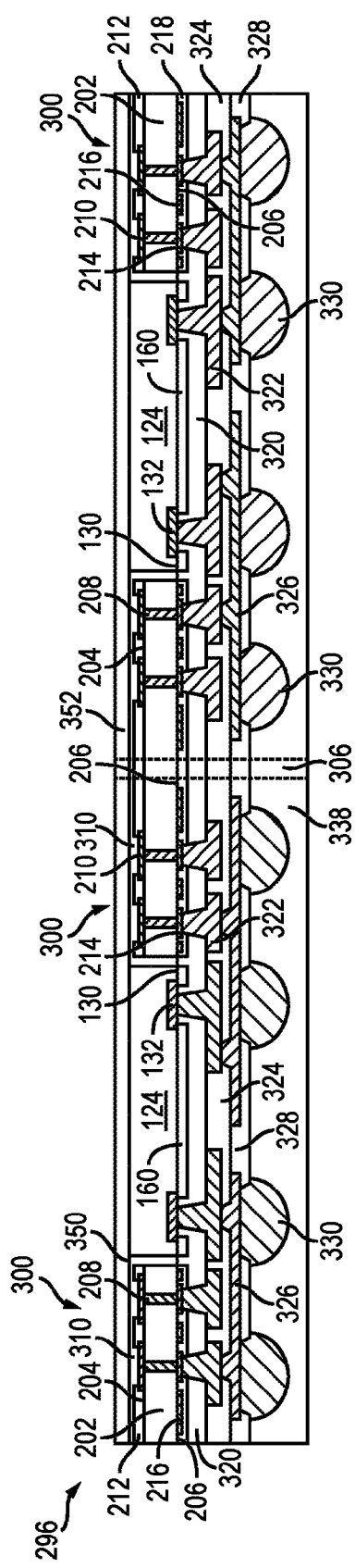
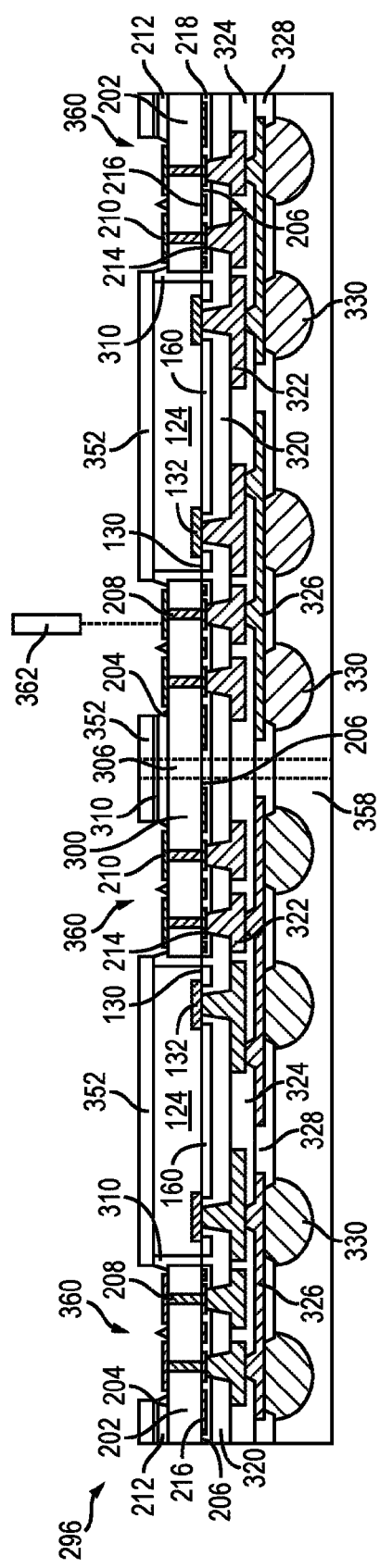
FIG. 5i
FIG. 5j

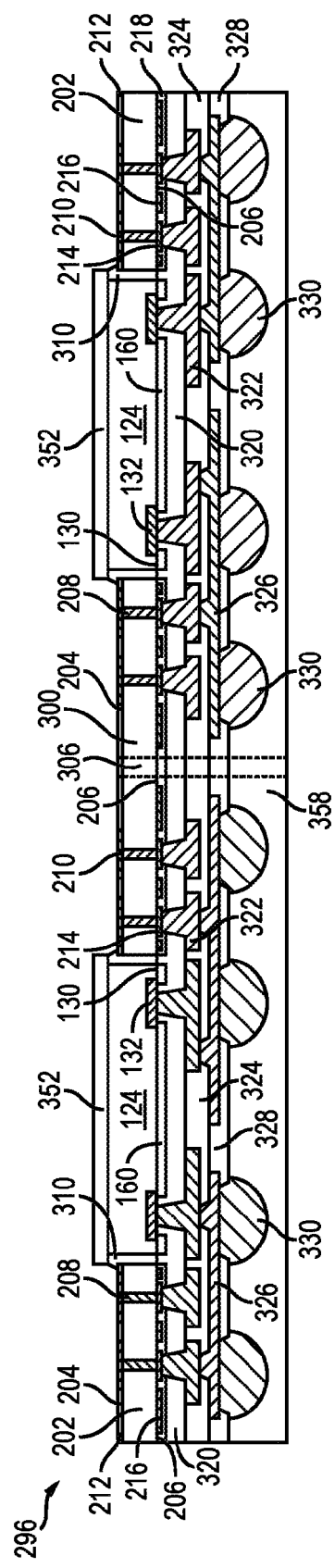
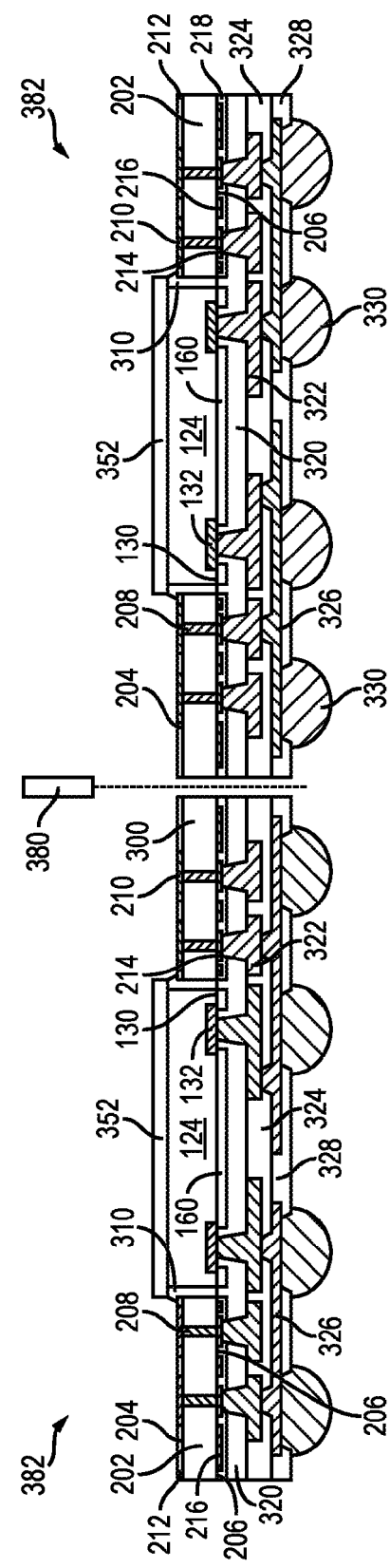
FIG. 7a
FIG. 7b

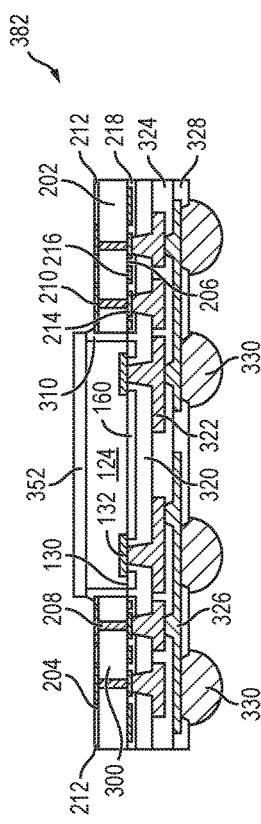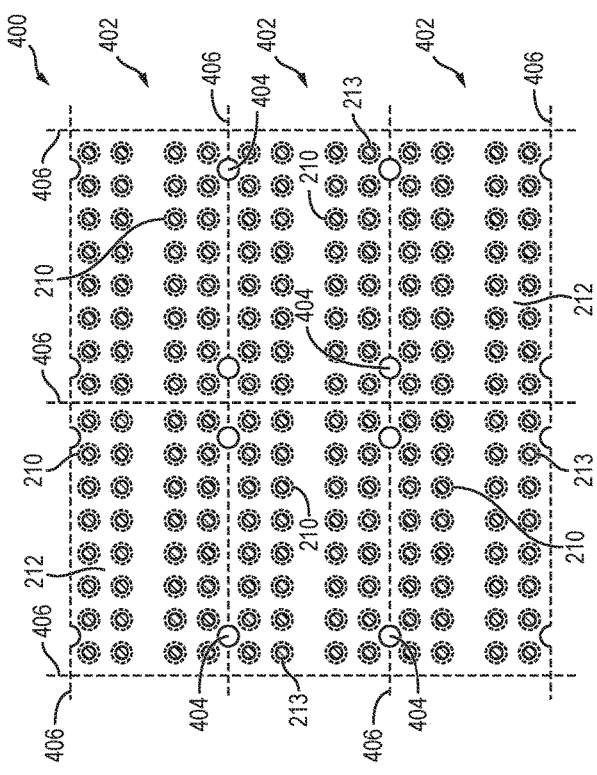

SEMICONDUCTOR DEVICE AND METHOD OF BALANCING SURFACES OF AN EMBEDDED PCB UNIT WITH A DUMMY COPPER PATTERN

CLAIM OF DOMESTIC PRIORITY

The present application is a continuation of U.S. patent application Ser. No. 14/329,464, now U.S. Pat. No. 9,449,943, filed Jul. 11, 2014, which claims the benefit of U.S. Provisional Application No. 61/897,176, filed Oct. 29, 2013, which applications are incorporated herein by reference.

FIELD OF THE INVENTION

The present invention relates in general to semiconductor devices and, more particularly, to a semiconductor device and method of forming printed circuit board (PCB) units with top and bottom conductive layers balanced by a dummy copper pattern.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

The manufacturing of smaller semiconductor devices relies on implementing improvements to horizontal and vertical electrical interconnection between multiple semiconductor devices on multiple levels, i.e., three dimensional (3-D) device integration. One approach to achieving the objectives of greater integration and smaller semiconductor devices is to embed PCB units adjacent to a semiconductor die in a single package. PCB units include preformed conductive vias, or plated through-holes (PTH), used to route electrical signals through a semiconductor package. Contact pads on a bottom, or front, side of a PCB unit are connected to an RDL formed over the PCB unit and a semiconductor die. Contact pads on a top, or back, side of the PCB unit are exposed opposite the RDL layer for subsequent interconnection with a second semiconductor package or other external device in a package on package (PoP) configuration.

Embedded PCB units used in semiconductor packages are commonly formed with contact pads on the top side of the PCB unit which are larger than contact pads on the bottom side of the PCB unit. Contact pads on the top side of a PCB unit can be formed larger due to the capability of equipment used in manufacturing the PCB unit, or because of different registration tolerances of the equipment used during subsequent interconnection steps. However, larger contact pads on the top side of a PCB unit results in more total conductive material on the top side of the PCB unit and creates an imbalance between the sides of the PCB unit. The imbalance of conductive material between the top side and bottom side of a PCB unit causes warpage in the PCB unit which proves problematic during encapsulation and compressive molding of the semiconductor package. Many common manufacturing problems which can occur during compressive molding are more likely to occur when the top side and bottom side of a PCB unit are unbalanced. Warpage of the PCB unit causes gaps between the PCB unit and a carrier. The PCB unit does not lie flat and fully contact carrier tape on the carrier when warped, leading to increased instances of mold bleed and flying PCB units.

Mold bleed occurs during compressive molding when encapsulant bleeds underneath a PCB unit. Encapsulant under the PCB unit causes manufacturing defects by covering contact pad surfaces and interfering with electrical connection between the PCB unit and a subsequently formed RDL. Flying PCB units occur when encapsulant applies a lateral force to a PCB unit during compressive molding which causes the PCB unit to move. The movement of a PCB unit during encapsulation prevents subsequent RDLs from making proper contact with the PCB unit as required by the design of the semiconductor die and package.

SUMMARY OF THE INVENTION

A need exists for a PCB unit which reduces the occurrence of mold bleed and flying PCBs. Accordingly, in one embodiment, the present invention is a method of making a semiconductor device comprising the steps of providing a substrate, forming a plurality of first contact pads over a first surface of the substrate, forming a plurality of second contact pads over a second surface of the substrate, and forming a dummy pattern over the second surface of the substrate.

In another embodiment, the present invention is a method of making a semiconductor device comprising the steps of providing a substrate, forming a first conductive layer over a first surface of the substrate, forming a second conductive layer over a second surface of the substrate, and forming a dummy pattern over the second surface of the substrate to balance the first conductive layer and second conductive layer.

In another embodiment, the present invention is a method of making a semiconductor device comprising the steps of providing a substrate, forming a first conductive layer over a first surface of the substrate, and forming a dummy pattern over a second surface of the substrate.

In another embodiment, the present invention is a semiconductor device comprising a substrate. A first conductive layer is formed over a first surface of the substrate. A dummy pattern is formed over a second surface of the substrate.

BRIEF DESCRIPTION OF THE DRAWINGS

FIGS. 2a-2e illustrate a semiconductor wafer with a plurality of semiconductor die separated by a saw street;

FIGS. 3a-3i illustrate a method of forming a PCB unit with a dummy conductive pattern;

FIGS. 4a-4h illustrate alternative embodiments of the PCB unit formed in FIGS. 3a-3i;

FIGS. 5a-5k illustrate a method of forming a semiconductor package utilizing the semiconductor die of FIGS. 2a-2e and the PCB unit of FIGS. 3a-3i;

FIGS. 7a-7c illustrate an alternative embodiment for forming a semiconductor package utilizing the semiconductor die of FIGS. 2a-2e and the PCB unit of FIGS. 3a-3i; and FIGS. 8a-8i illustrate alternative embodiments of forming the reconstituted wafer of FIGS. 5a-5b.

DETAILED DESCRIPTION OF THE DRAWINGS

Figure 1:
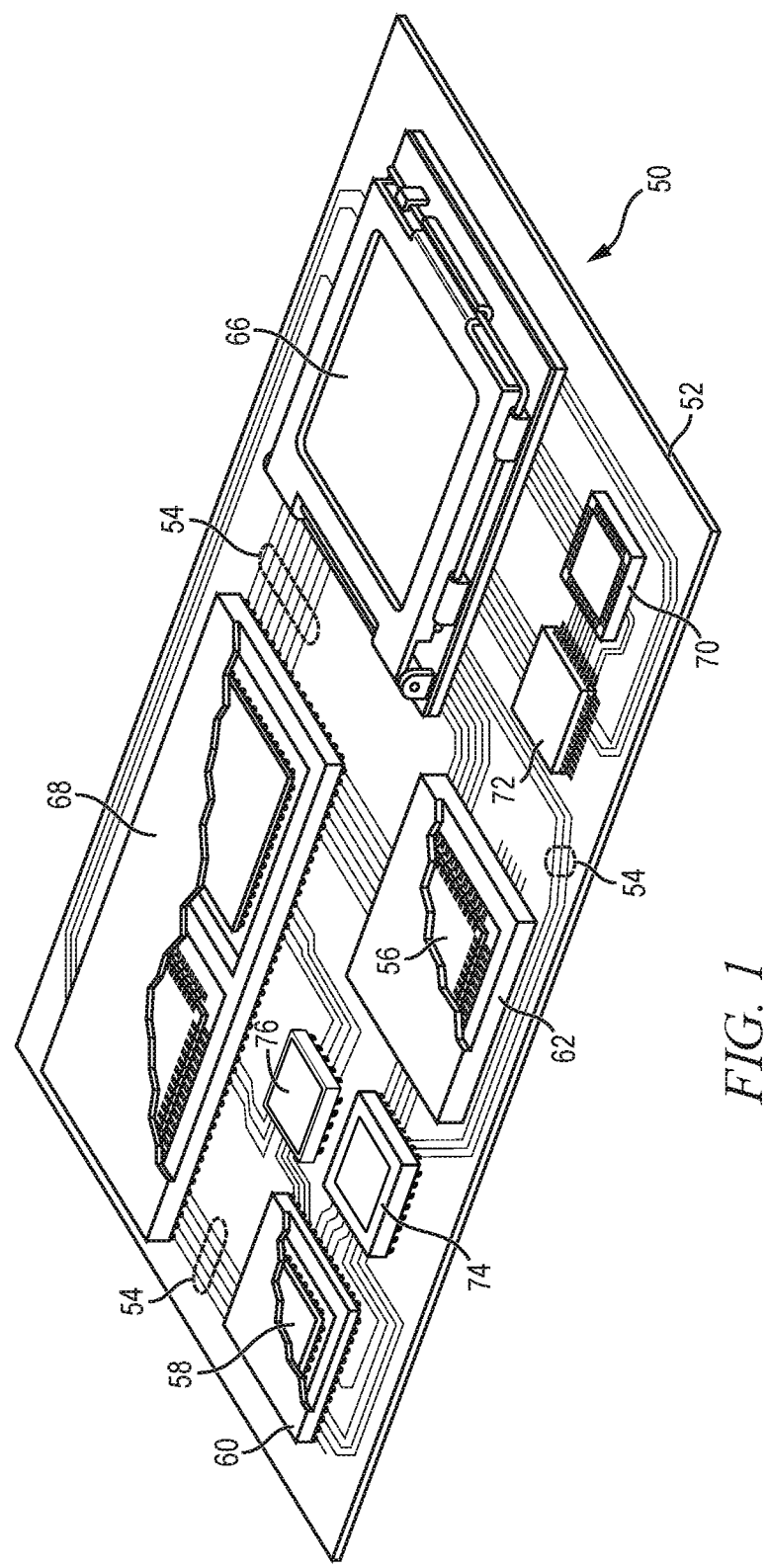
FIG. 1 illustrates a PCB with different types of packages mounted to a surface of the PCB.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
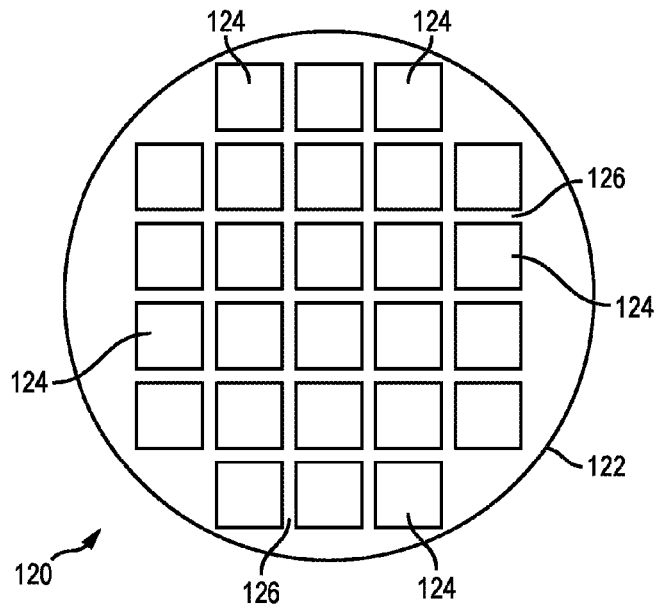

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 100-450 millimeters (mm).

Figure 2B:
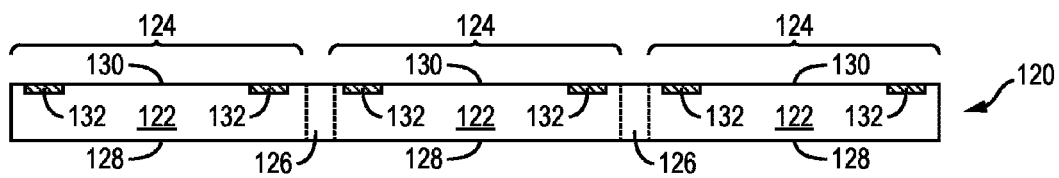

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating, or other suitable metal deposition process. Conductive layer 132 can be one or more layers of aluminum (Al), copper (Cu), tin (Sn), nickel (Ni), gold (Au), silver (Ag), or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 2b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 2C:
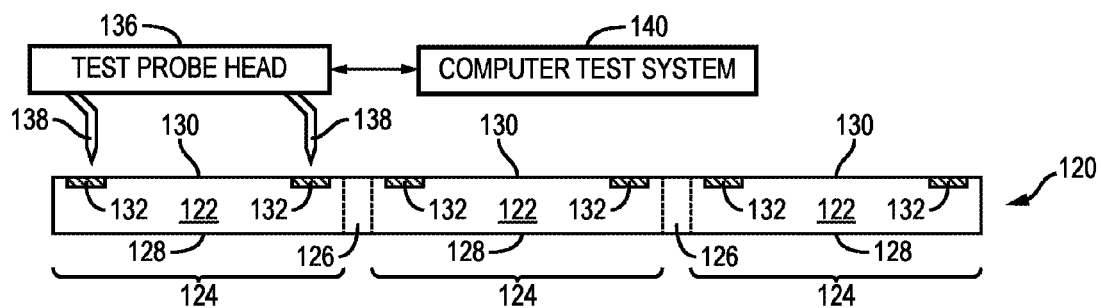

The active and passive components within semiconductor die 124 undergo testing at the wafer level for electrical performance and circuit function. Each semiconductor die 124 is tested for functionality and electrical parameters, as shown in FIG. 2c, using a test probe head 136 including a plurality of probes or test leads 138, or other testing device. Probes 138 are used to make electrical contact with nodes or contact pads 132 on each semiconductor die 124 and provide electrical stimuli to contact pads 132. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

In FIG. 2d, insulating or passivation layer 160 is formed over active surface 130 of semiconductor wafer 120. Insulating layer 160 is formed using PVD, CVD, printing, lamination, spin coating or spray coating. Insulating layer 160 contains one or more layers of silicon dioxide (SiO2), silicon nitride (Si3N4), silicon oxynitride (SiON), tantalum pentoxide (Ta2O5), aluminum oxide (Al2O3), solder resist, or other material having similar insulating and structural properties. A portion of insulating layer 160 is removed by etching or laser direct ablation (LDA) to form openings in the insulating layer and expose conductive layer 132 for subsequent electrical interconnect.

In FIG. 2e, semiconductor wafer 120 is singulated through saw street 126 using a saw blade or laser cutting tool 170 into individual semiconductor die 124. The individual semiconductor die 124 can be inspected and electrically tested for identification of KGD post singulation.

Figure 3A:
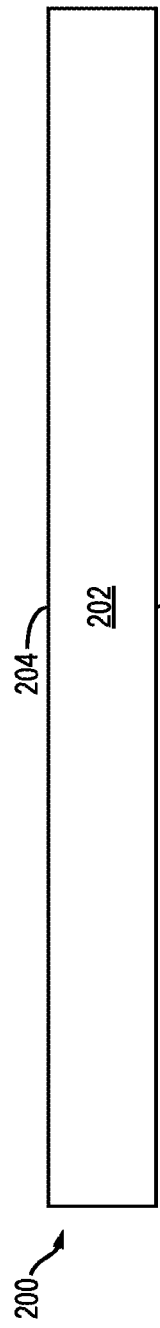

FIGS. 3a-3i illustrate, in relation to FIGS. 1 and 2a-2e, a process of forming a PCB unit 200 to be packaged adjacent to semiconductor die 124 for electrical interconnection through the semiconductor package. FIG. 3a shows a cross-sectional view of a portion of core substrate 202. Core substrate 202 includes one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. In one embodiment, core substrate 202 is a composite with woven fiber and filler. Alternatively, core substrate 202 includes one or more insulating or passivation layers. Core substrate 202 includes top, or back, surface 204 and bottom, or front, surface 206. In one embodiment, a coefficient of thermal expansion (CTE) of core substrate 202 is in the range of 4-15 ppm/° C.

Figure 3B:
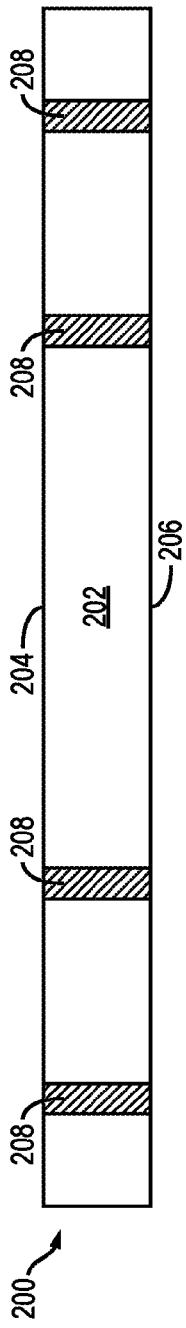

In FIG. 3b, a plurality of through vias is formed through core substrate 202 using laser drilling, mechanical drilling, or deep reactive ion etching (DRIE). The vias extend completely through core substrate 202, from surface 204 to surface 206. The vias are filled with Al, Cu, Sn, Ni, Au, Ag, titanium (Ti), tungsten (W), or other suitable electrically conductive material using electrolytic plating, electroless plating, or other suitable deposition process to form z-direction vertical interconnect conductive vias or PTHs 208. Alternatively, a conductive layer is formed over the sidewalls of the through vias using PVD, CVD, electrolytic plating, electroless plating, or other suitable metal deposition process, and a center portion of the through vias is filled with a conductive filler material, e.g., Cu paste, or an insulating filler material, e.g., a polymer plug.

Figure 3C:
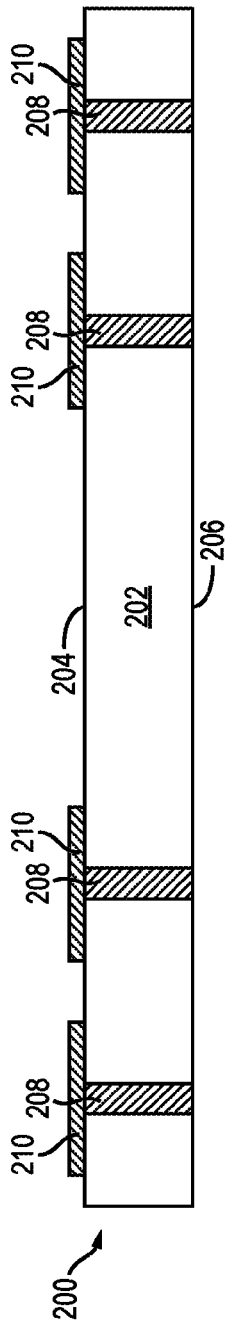

In FIG. 3c, an electrically conductive layer 210 is formed over surface 204 of core substrate 202 and conductive vias 208 using a patterning and metal deposition process such as printing, PVD, CVD, sputtering, electrolytic plating, or electroless plating. Conductive layer 210 includes one or more layers of Al, Cu, Sn, Ni, Au, Ag, or other suitable electrically conductive material. Conductive layer 210 is electrically connected to conductive vias 208. Conductive layer 210 operates as contact pads electrically connected to conductive vias 208. In other embodiments, conductive layer 210 forms optional fiducial markers in addition to contact pads. In one embodiment, a thickness of conductive layer 210 is in the range of 10-40 μm.

Contact pads 210 are exposed in the final semiconductor package for subsequent electrical interconnection with other semiconductor packages or electronic devices in a PoP configuration. Another semiconductor package will include conductive bumps, pillars, or other interconnect structures which are mechanically bonded and electrically connected to contact pads 210. Vias 208 transfer electric signals from the other semiconductor package through PCB unit 200. Contact pads 210 are formed a certain size based on the requirements of the interconnect structure of the other semiconductor package, the capabilities of the equipment forming contact pads 210, and a registration tolerance of equipment used to expose the contact pads. Contact pads 210 are formed in an approximately circular shape when viewed from above surface 204. However, other shapes for contact pads 210 are used in other embodiments.

Figure 3D:
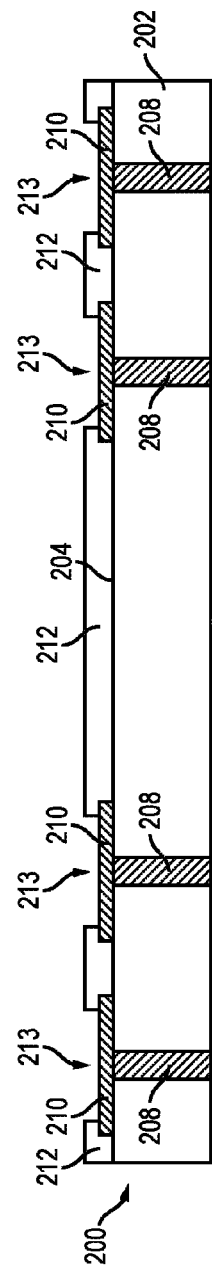

In FIG. 3d, an insulating or passivation layer 212 is formed over surface 204 of core substrate 202 and contact pads 210 using PVD, CVD, printing, spin coating, spray coating, slit coating, rolling coating, lamination, sintering, or thermal oxidation. Insulating layer 212 includes one or more layers of SiO2, Si3N4, SiON, Ta2O5, Al2O3, Hafnium Oxide (HfO2), benzocyclobutene (BCB), polyimide (PI), polybenzoxazoles (PBO), polymer dielectric resist with or without fillers or fibers, or other material having similar structural and dielectric properties. A portion of insulating layer 212 is removed by LDA, etching, or other suitable process to form openings 213 and expose portions of contact pads 210. In some embodiments, insulating layer 212 operates as a solder mask for subsequent interconnection steps.

Figure 3E:
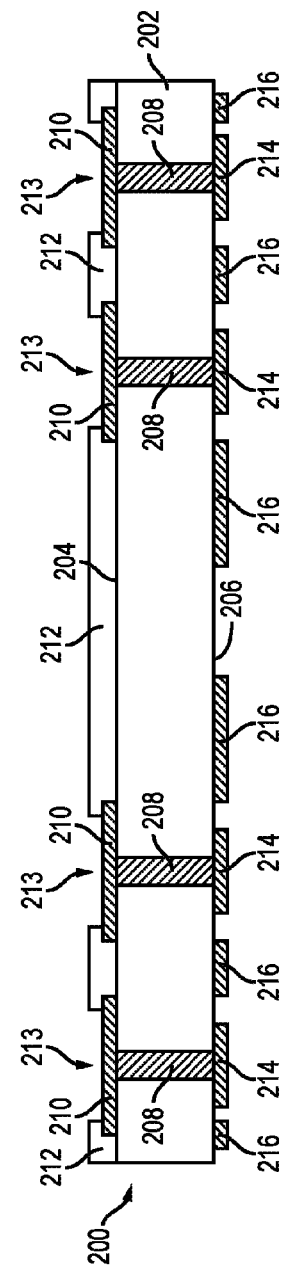

FIG. 3e shows electrically conductive layer 214-216 formed over surface 206 of core substrate 202 and conductive vias 208 using a patterning and metal deposition process such as printing, PVD, CVD, sputtering, electrolytic plating, or electroless plating. Conductive layer 214-216 includes one or more layers of Al, Cu, Sn, Ni, Au, Ag, or other suitable electrically conductive material. In one embodiment, a thickness of conductive layer 214-216 is in the range of 10-40 μm.

Conductive layer 214-216 includes contact pads 214 and dummy pattern 216. Fiducial markers, illustrated in FIG. 3h, are also formed on surface 206 as a part of conductive layer 214-216. Contact pads 214 are electrically connected to contact pads 210 through conductive vias 208. In later processing steps, an RDL is formed over surface 206 and is electrically connected to contact pads 214. Contact pads 214 are formed smaller than contact pads 210 due to a better registration tolerance of the manufacturing equipment which exposes contact pads 214 as compared to the equipment which exposes contact pads 210, and because other packages connecting to contact pads 210 require a larger contact pad than the subsequently formed RDL connecting to contact pads 214. Contact pads 214 include a surface area which is less than the surface area of contact pads 210 due to contact pads 214 having a smaller width or diameter than contact pads 210. Contact pads 214 are formed in an approximately circular shape when viewed from above surface 206. However, other shapes for contact pads 214 are used in other embodiments.

Individual portions of dummy pattern 216 are electrically isolated. The term dummy pattern refers to a pattern formed not for the use which a conductive pattern is commonly used for, i.e., electrical interconnection, but instead formed to add weight to balance the sides of a PCB unit. In other embodiments, dummy pattern 216 is used for additional purposes, e.g., a ground plane. Dummy pattern 216 is designed to make up for the difference in surface area covered by contact pads 214 compared to the surface area covered by contact pads 210. Dummy pattern 216 is formed so that the total area of surface 206 covered by dummy pattern 216 and contact pads 214 in combination is approximately equal to the area of surface 204 covered by contact pads 210. In one embodiment, the area covered by contact pads 214 and dummy pattern 216 together is within 20% of the area covered by contact pads 210. In another embodiment, the area covered by contact pads 214 and dummy pattern 216 together is within 10% of the area covered by contact pads 210.

Using dummy pattern 216 to balance the area of surface 204 covered by conductive material with the area of surface 206 covered by conductive material reduces warpage of PCB unit 200. When warpage of PCB unit 200 is limited, the PCB unit lies flat on a carrier. Instances of mold bleed and flying PCBs are reduced during subsequent compressive molding of a semiconductor package including PCB unit 200. Dummy pattern 216 can be formed in any pattern on surface 206. In one embodiment, dummy pattern 216 is formed as a plurality of quadrilaterals, each in the center of four adjacent contact pads 214.

Figure 3F:
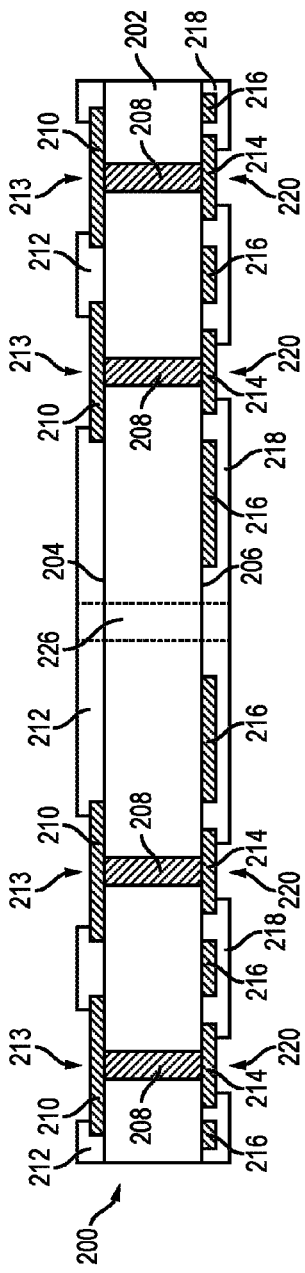

In FIG. 3f, an insulating or passivation layer 218 is formed over surface 206 of core substrate 202, contact pads 214, and dummy pattern 216 using PVD, CVD, printing, spin coating, spray coating, slit coating, rolling coating, lamination, sintering, or thermal oxidation. Insulating layer 218 includes one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 218 is removed by LDA, etching, or other suitable process to form openings 220 and expose portions of contact pads 214. In some embodiments, insulating layer 212 operates as a solder mask for subsequent interconnection steps. Openings 220 in insulating layer 218 are formed with approximately the same size as openings 213 in insulating layer 212 to control warpage of PCB unit 200. In one embodiment, openings 220 are formed to have a size within 20% of a size of openings 213. Dummy pattern 216 remains covered by insulating layer 218. FIG. 3f shows a cross-sectional view of a portion of a completed PCB unit 200.

FIG. 3g illustrates a plan view of PCB unit 200 from over surface 204 in one embodiment. Insulating layer 212 is viewable directly. A center portion of each individual contact pad 210 is viewable directly through openings 213. A peripheral portion of each individual contact pad 210 is hidden from view under insulating layer 212 and illustrated as a dotted line. Dicing kerf or saw street 226 is an area of PCB unit 200 reserved for subsequently dicing two semiconductor packages formed adjacent to each other. Semiconductor packages are manufactured in a reconstituted wafer, with numerous PCB units 200 laid out adjacent to numerous semiconductor die 124 or other electronic devices. After dicing the reconstituted wafer, the portions of PCB unit 200 separated by saw street 226 each form a portion of a separate semiconductor package with a different semiconductor die 124.

FIG. 3h illustrates a plan view of PCB unit 200 from over surface 206 in the same embodiment as FIG. 3g. Insulating layer 218 is viewable directly. A center portion of each individual contact pad 214 is viewable directly through openings 220. A peripheral portion of each contact pad 214 is hidden under insulating layer 218 and illustrated as a dotted line. Dummy pattern 216 is hidden under insulating layer 218 and illustrated as dotted lines. Dummy pattern 216 is formed in other shapes or patterns and in other locations in other embodiments. Saw street 226 separates two halves of PCB unit 200. Saw street 226 is an area of PCB unit 200 reserved for subsequently singulating two adjacent semiconductor packages, with each semiconductor package including half of PCB unit 200. Fiducial markers 230 are formed on surface 206 and are used during subsequent processing steps to align PCB unit 200. Fiducial markers 230 include characters or symbols formed as a conductive layer along with contact pads 214 and dummy pattern 216 exposed through openings in insulating layer 218 formed along with openings 220.

Figure 3I:
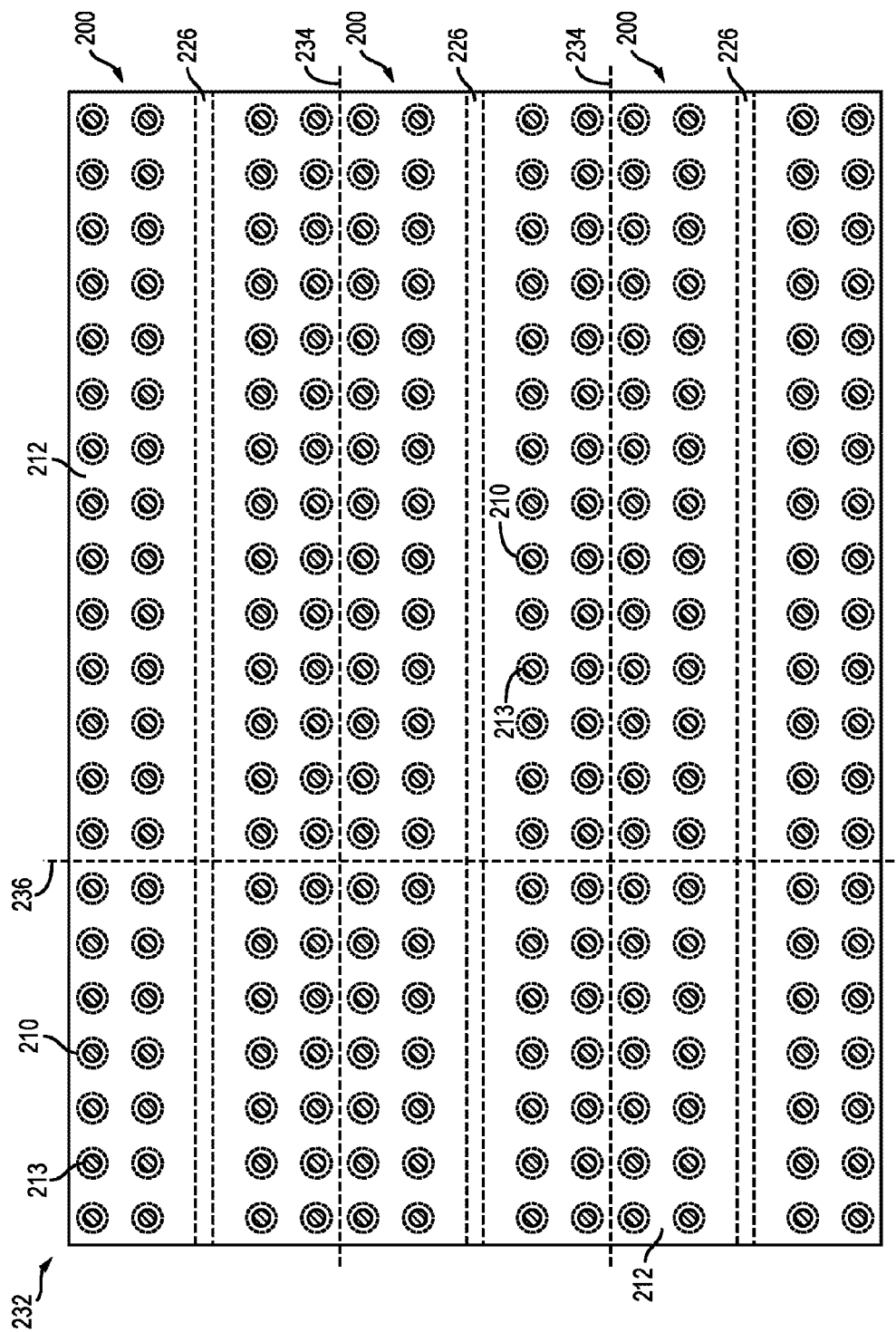

In one embodiment, core substrate 202 is provided as a laminate strip large enough for a plurality of PCB units 200 to be formed at once. FIG. 3i illustrates PCB panel 232 with three adjacently formed PCB units 200. Panel 232 is singulated through dicing kerfs or saw streets 234 to separate PCB units 200 after contact pads 210, contact pads 214, dummy pattern 216, insulating layer 212, and insulating layer 218 are formed. Panel 232 is singulated using a laser cutting tool or saw blade. In one embodiment, a saw blade with a grit size in the range of 100 to 3000 is used to singulate PCB panel 232. In another embodiment, a saw blade with a grit size in the range of 200-1000 is used to singulate PCB panel 232.

In other embodiments, PCB panel 232 can be singulated perpendicularly to saw streets 234 to create different lengths of PCB units if desired for a specific package design. For example, in one embodiment PCB panel 232 is singulated through dicing kerf or saw street 236, in addition to saw streets 234, to create PCB units of two different lengths. In some embodiments, vias 208, contact pads 210, and contact pads 214 are formed on core substrate 202 in other patterns or in other amounts of columns and rows. FIGS. 8a-8i illustrate other patterns used to form PCB units, but are not an exhaustive illustration of possible patterns.

FIGS. 4a-4h illustrate, in relation to FIGS. 3a-3i, alternative embodiments of forming a PCB unit. FIG. 4a shows PCB unit 240 which includes conductive pillars 242 instead of conductive vias 208 as with PCB unit 200 in FIG. 3f. Pillars 242 are shaped similarly to an hourglass, with ends toward surfaces 204 and 206 which are thicker than a center of pillars 242. Other than the formation of conductive pillars 242 instead of vias 208, PCB unit 240 is formed and operates similarly to PCB unit 200.

FIG. 4b illustrates PCB unit 250 which includes conductive pillars 252 instead of conductive vias 208 as with PCB unit 200 in FIG. 3f. Conductive pillars 252 are shaped similarly to a cone, with an end toward surface 204 which is thicker than an opposite end toward surface 206, and a gradient in thickness between the two ends of pillars 252. Other than the formation of pillars 252 instead of vias 208, PCB unit 250 is formed and operates similarly to PCB unit 200.

FIG. 4c illustrates PCB unit 260 with openings 262 formed in insulating layer 212 instead of openings 213, and additional dummy openings 264 formed in insulating layer 218 in addition to openings 220. The term dummy opening refers to an opening formed not for the use which an opening is commonly used for, i.e., electrical interconnection to a conductive layer through the opening, but instead formed to reduce weight and balance the sides of a PCB unit. In some embodiments of PCB unit 260, a limited conductive dummy pattern is formed on surface 204 adjacent to contact pads 210, similar to dummy pattern 216. A lateral distance of at least 50 µm is maintained between contact pads 210 and the optional limited dummy pattern formed on surface 204.

Openings 262 are similar to openings 213, but are formed larger than contact pads 210. Each individual contact pad 210 is completely within a footprint of an individual opening 262. In PCB unit 260, no portion of insulating layer 212 overlies contact pads 210. Openings 262 allow for a subsequent non solder mask defined (NMSD) interconnection. An interconnect structure is bonded to contact pad 210 without contacting insulating layer 212, i.e., insulating layer 212 does not act as a solder mask. The shape of the interconnect structure is not defined by opening 262 in insulating layer 212. In one embodiment, a thickness of insulating layer 212 is greater than a thickness of contact pads 210 by less than or equal to 20 μm. In another embodiment, a thickness of insulating layer 212 is greater than a thickness of contact pads 210 by less than or equal to 5 μm.

Due to the larger size of openings 262 in PCB unit 260 as compared to openings 220, an imbalance is created between the amount of material in insulating layer 212 over surface 204 and the amount of material in insulating layer 218 over surface 206. The imbalance in covered surface area between insulating layer 212 and insulating layer 218 increases a risk of warpage of PCB unit 260. To keep the coverage area of insulating layer 212 approximately equal to the coverage area of insulating layer 218, and reduce warpage of PCB unit 260, dummy openings 264 are formed in insulating layer 218 by LDA, etching, or other suitable process. Dummy openings 264 are formed through insulating layer 218 over core substrate 202 or over dummy pattern 216. In one embodiment, some dummy openings 264 are formed over dummy pattern 216 and some dummy openings 264 are formed over core substrate 202 outside a footprint of dummy pattern 216 and contact pads 214. Dummy openings 264 are formed so that the total area of dummy openings 264 and openings 220 in insulating layer 218 is approximately equal to the area of openings 262 in insulating layer 212. In one embodiment, the area of dummy openings 264 and openings 220 in combination is within 10% of the area of openings 262.

FIGS. 4d-4f illustrate PCB unit 269 including a plurality of conductive vias 270 electrically connecting each individual contact pad 210 to a respective individual contact pad 214. In the illustrated embodiment, two conductive vias 270 are used per individual contact pad 210 and contact pad 214, however more than two conductive vias can be utilized per pair of opposing contact pads.

FIG. 4d shows a partial cross-section of PCB unit 269 with two conductive vias 270 per contact pad 210 and contact pad 214. Conductive vias 270 are formed similarly to conductive vias 208 in PCB unit 200. Contact pads 210 and 214 can be a round, oval, oblong, or other shape as required to contact multiple conductive vias 270.

FIG. 4e illustrates two conductive vias 270 used per contact pad 210, with the two conductive vias 270 oriented perpendicular to saw street 226. Contact pad 210 is formed in an oval shape to contact both conductive vias 270. FIG. 4f illustrates two conductive vias 270 oriented in parallel with saw street 226 and an oval shaped contact pad 210. Two conductive vias 270 oriented in parallel with saw street 226, with an oval or oblong contact pad 210, reduce the required width of PCB unit 269 and allow for additional clearance between contact pads 210 and a semiconductor die subsequently packaged adjacent to PCB unit 269. Other orientations of multiple conductive vias 270 are used in other embodiments.

FIG. 4g illustrates 3D molding compound bar 273. 3D molding compound bar 273 includes core substrate 274 having opposing surfaces 276 and 278. Core substrate 274 operates similarly to core substrate 202 in PCB unit 200, but core substrate 274 is formed from a molding compound using a molding or lamination process with curing. Core substrate 274 can be formed from polymer composite material, such as epoxy resin with filler, epoxy acrylate with filler, or polymer with proper filler.

A plurality of through-mold vias is formed through core substrate 274 using laser drilling, mechanical drilling, or DRIE. In one embodiment, double sided laser drilling is used. The vias extend completely through core substrate 274, from surface 276 to surface 278. The vias are filled with Al, Cu, Sn, Ni, Au, Ag, Ti, W, or other suitable electrically conductive material using electrolytic plating, electroless plating, or other suitable deposition process to form z-direction vertical interconnect conductive vias or PTHs 280. In one embodiment, conductive vias 280 are formed using a modified semi-additive plating (MSAP) process.

After conductive vias 280 are formed, an electrically conductive layer 282 is formed over surface 276 of core substrate 274 and conductive vias 280 using a patterning and metal deposition process such as printing, PVD, CVD, sputtering, electrolytic plating, or electroless plating. Conductive layer 282 includes one or more layers of Al, Cu, Sn, Ni, Au, Ag, or other suitable electrically conductive material. Conductive layer 282 is similar to conductive layer 210 of PCB unit 200, and is electrically connected to conductive vias 280. Conductive layer 282 operates as contact pads electrically connected to conductive vias 280. The contact pads of conductive layer 282 are formed in an approximately circular shape, although other shapes of contact pads are used in other embodiments.

Electrically conductive layer 284-286 is formed over surface 278 of core substrate 274 and conductive vias 280 using a patterning and metal deposition process such as printing, PVD, CVD, sputtering, electrolytic plating, or electroless plating. Conductive layer 284-286 includes one or more layers of Al, Cu, Sn, Ni, Au, Ag, or other suitable electrically conductive material.

Conductive layer 284-286 includes contact pads 284, similar to contact pads 214, and dummy pattern 286, similar to dummy pattern 216. Fiducial markers are also formed on surface 278 as a part of conductive layer 284-286. Contact pads 284 are electrically connected to contact pads 282 through conductive vias 280. In later processing steps, an RDL is formed over and electrically connected to contact pads 284. Contact pads 284 are formed smaller than contact pads 282 due to a better registration tolerance of the manufacturing equipment which exposes and electrically connects contact pads 284 as compared to the equipment which exposes and electrically connects contact pads 282.

Individual portions of dummy pattern 286 are electrically isolated. In other embodiments, dummy pattern 286 is used for another purpose, e.g., a ground plane. Dummy pattern 286 is designed to make up for the difference in surface area covered by contact pads 284 compared to the surface area covered by contact pads 282. Contact pads 284 are formed smaller than contact pads 282, which creates an imbalance between surface 276 and surface 278. Contact pads 284 are formed in an approximately circular shape when viewed from above surface 278. However, other shapes for contact pads 284 are used in other embodiments.

Dummy pattern 286 is formed so that the total area of surface 278 covered by dummy pattern 286 and contact pads 284 in combination is approximately equal to the area of surface 276 covered by contact pads 282. In one embodiment, the area covered by contact pads 284 and dummy pattern 286 together is within 20% of the area covered by contact pads 282. In another embodiment, the area covered by contact pads 284 and dummy pattern 286 together is within 10% of the area covered by contact pads 282. Using dummy pattern 286 to balance the conductive material formed on surface 276 and surface 278 reduces warpage of 3D molding compound bar 273, controlling mold bleed and avoiding flying PCB units during subsequent compressive molding of a semiconductor package. Dummy pattern 286 can be formed in any pattern on surface 278. In one embodiment, dummy pattern 286 is formed as a plurality of quadrilaterals, each in the center of four adjacent contact pads 284.

An insulating or passivation layer 288 is formed over surface 278 of core substrate 274 using PVD, CVD, printing, spin coating, spray coating, slit coating, rolling coating, lamination, sintering, or thermal oxidation. Insulating layer 288 includes one or more layers of SiO2, Si3N4, SiON, Ta2O5, Al2O3, HfO2, BCB, PI, PBO, polymer dielectric resist with or without fillers or fibers, or other material having similar structural and dielectric properties. In one embodiment, a thickness of insulating layer 288 is greater than a thickness of contact pads 284 and dummy pattern 286. In another embodiment, a thickness of insulating layer 288 is less than a thickness of contact pads 284 and dummy pattern 286. In some embodiments, insulating layer 288 operates as a solder mask for subsequent interconnection steps. In some embodiments, an insulating layer similar to insulating layer 288 is also formed over surface 276 of core substrate 274. After formation, 3D molding compound bar 273 is used similarly to PCB unit 200.

FIG. 4h illustrates 3D molding compound bar 289. 3D molding compound bar 289 includes core substrate 274 and conductive vias 280 from FIG. 4g. A grinding or wet etching process is used on surfaces 276 and 278. In one embodiment, contact pads 282, contact pads 284, dummy pattern 286, and insulating layer 288 are formed over core substrate 274, and then the grinding or wet etching process is used to leave only core substrate 274 and conductive vias 280. 3D molding compound bar 289 is used similarly to PCB unit 200.

FIG. 5a shows a cross-sectional view of a portion of a carrier or temporary substrate 290 containing sacrificial base material such as silicon, polymer, beryllium oxide, glass, or other suitable low-cost, rigid material for structural support. An interface layer or double-sided tape 292 is formed over carrier 290 as a temporary adhesive bonding film, etch-stop layer, or thermal release layer.

Carrier 290 can be a round or rectangular panel (greater than 300 mm) with capacity for multiple semiconductor die 124 and PCB units. Carrier 290 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 290 is selected independent of the size of semiconductor die 124 or size of semiconductor wafer 120. That is, carrier 290 has a fixed or standardized size, which can accommodate various size semiconductor die 124 singulated from one or more semiconductor wafers 120. In one embodiment, carrier 290 is circular with a diameter of 330 mm. In another embodiment, carrier 290 is rectangular with a width of 560 mm and length of 600 mm. Semiconductor die 124 may have dimensions of 10 mm by 10 mm, which are placed on the standardized carrier 290. Alternatively, semiconductor die 124 may have dimensions of 20 mm by 20 mm, which are placed on the same standardized carrier 290. Accordingly, standardized carrier 290 can handle any size semiconductor die 124 and PCB units, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 290 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

Reconstituted wafer 296 is formed by mounting semiconductor die 124 from FIG. 2e and PCB units 300 to carrier 290 and interface layer 292 using, for example, a pick and place operation with active surface 130 of semiconductor die 124 and contact pads 214 of PCB units 300 oriented toward the carrier. Dummy pattern 216 reduces warpage of PCB units 300, allowing the PCB units to lie flat on interface layer 292. Accordingly, a surface of insulating layer 218 opposite core substrate 202 is completely contacting interface layer 292. No gaps are present between PCB units 300 and interface layer 292, reducing mold bleed and flying PCBs.

Figure 5B:
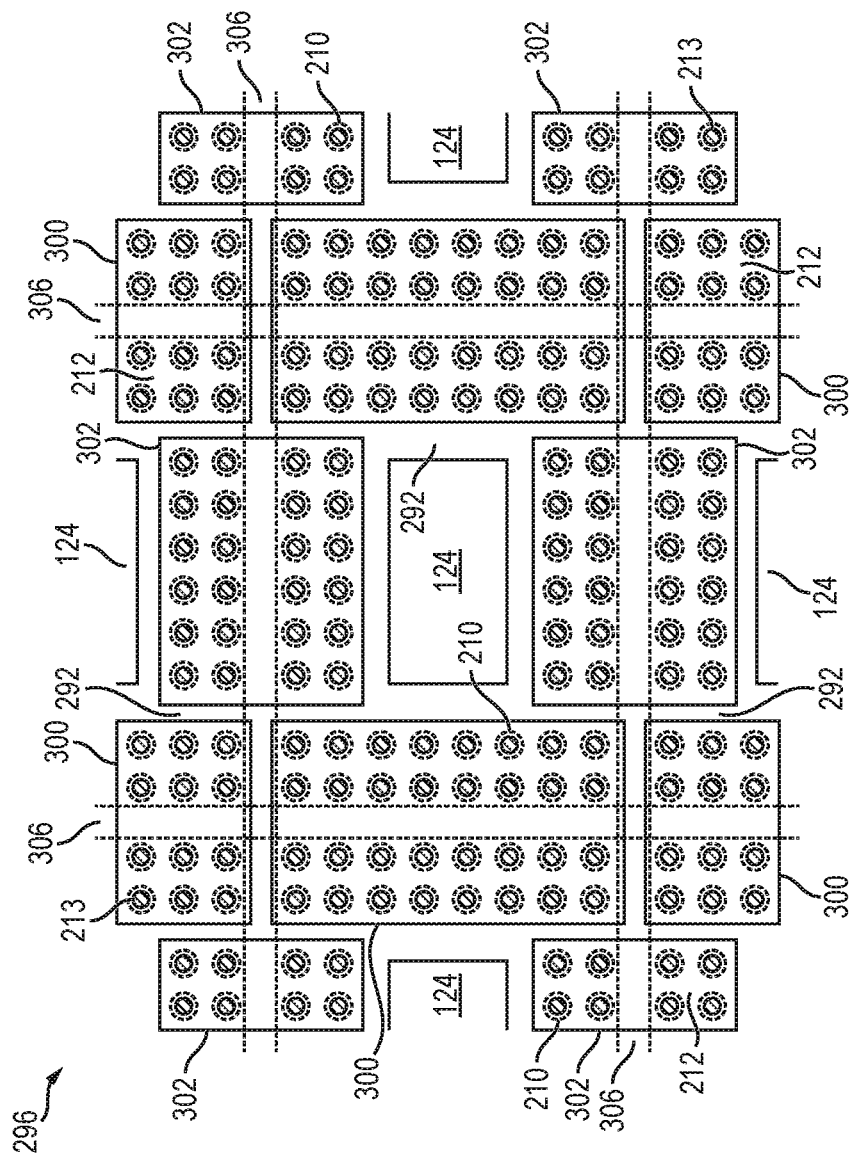

FIG. 5b shows a partial layout of reconstituted wafer 296 from FIG. 5a in plan view. Semiconductor die 124 are placed on carrier 290 and interface layer 292 at regular intervals. PCB units or Y-bars 300 are placed on interface layer 292 between horizontally adjacent semiconductor die 124. PCB units or X-bars 302 are placed on interface layer 292 between vertically adjacent semiconductor die 124. PCB units 300 and 302 are similar to PCB unit 200 from FIGS. 3f-3i, but PCB units 300 and 302 are cut from PCB panel 232 at different lengths. In plan view, contact pads 210 and insulating layer 212 of PCB units 300 and 302, as well as surface 128 of semiconductor die 124, are viewable directly. Space is provided between adjacent semiconductor die 124, PCB units 300, and PCB units 302 such that interface layer 292 is visible between the PCB units and semiconductor die. In other embodiments, PCB units 300 or PCB units 302 are cut to a shorter length to provide additional space between adjacent PCB units. Saw streets 306 indicate space reserved for subsequent singulation of individual semiconductor die 124 into separate packages.

In one embodiment, a distance of at least 300 μm is provided between semiconductor die 124 and adjacent PCB units 300 and 302. In another embodiment, a distance of at least 200 μm is provided between semiconductor die 124 and adjacent PCB units 300 and 302. In one embodiment, the distance between an individual contact pad 210 and an adjacent saw street 306 is 80 μm. PCB units 300 and 302 include a thickness which is less than a thickness of semiconductor die 124. In one embodiment, PCB units 300 and PCB units 302 are formed with core substrates having differing CTE values in order to balance reconstituted wafer 296 and reduce package warpage.

In FIG. 5c, an encapsulant or molding compound 310 is deposited over semiconductor die 124, PCB units 300 and 302, and carrier 290 as an insulating material using a paste printing, compressive molding, transfer molding, liquid encapsulant molding, vacuum lamination, spin coating, or other suitable applicator. In particular, encapsulant 310 covers the side surfaces and surface 128 of semiconductor die 124 and the side surfaces, insulating layer 212, and conductive layer 210 of PCB units 300 and 302. Encapsulant 310 can be polymer composite material, such as epoxy resin with filler, epoxy acrylate with filler, or polymer with proper filler. Encapsulant 310 is non-conductive and environmentally protects the semiconductor device from external elements and contaminants. Encapsulant 310 also protects semiconductor die 124 from degradation due to exposure to light.

Manufacturing defects, e.g., mold bleed and flying PCB units, occur when compressive molding is used to form encapsulant 310. Mold bleed occurs when encapsulant 310 bleeds between interface layer 292 and PCB unit 300, PCB unit 302, or semiconductor die 124. Mold bleed causes encapsulant 310 to cover contact pads 214 of PCB units 300 or 302 or conductive layer 132 of semiconductor die 124. When contact pads 214 or conductive layer 132 are covered, electrical contact with subsequently formed RDLs is difficult. In some instances, the encapsulant covering contact pads 214 or conductive layer 132 must be cleared using an additional processing step. In other instances, the encapsulant covering contact pads 214 or conductive layer 132 blocks a subsequently formed RDL and creates an electrical open circuit.

A flying PCB unit describes the condition when pressure from compressive molding of encapsulant 310 causes an individual PCB unit 300 or 302 to move relative to carrier 290. When a PCB unit 300 or 302 moves out of proper alignment on carrier 290, subsequently formed RDLs are unable to connect properly to contact pads 214. Because of dummy pattern 216, PCB units 300 and 302 include approximately the same amount of conductive material on surfaces 204 and surface 206. The balance of conductive material disposed on surface 204 and surface 206 reduces warpage, thereby controlling mold bleed and reducing flying PCB units during compressive molding.

In FIG. 5d, carrier 290 and interface layer 292 are removed by chemical etching, mechanical peeling, chemical mechanical planarization (CMP), mechanical grinding, thermal bake, UV light, laser scanning, or wet stripping to expose insulating layer 160 and conductive layer 132 of semiconductor die 124, as well as insulating layer 218 and contact pads 214 of PCB units 300 and 302. Surface 128 of semiconductor die 124, as well as the sides of the semiconductor die, remain covered by encapsulant 310 as a protective panel to increase yield, particularly when surface mounting the semiconductor die.

Figure 5E:
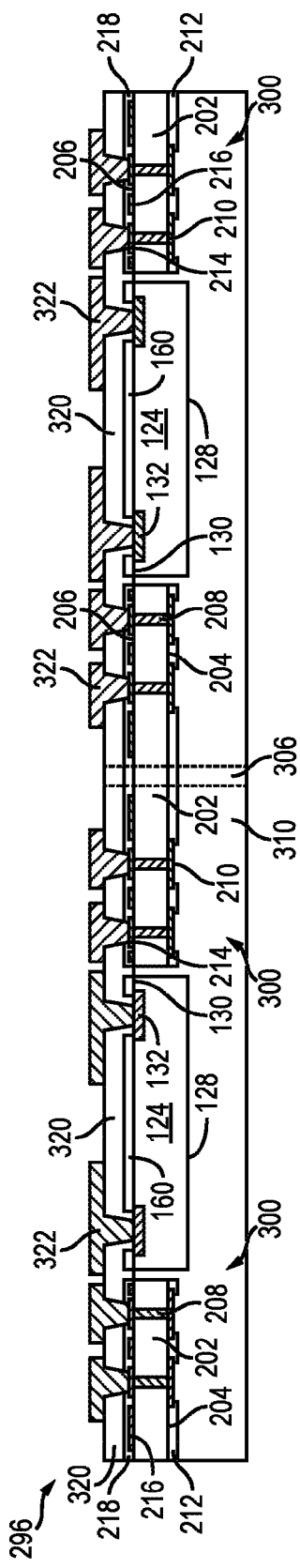

In FIG. 5e, an insulating or passivation layer 320 is formed over insulating layer 160, insulating layer 218, conductive layer 132, contact pads 214, and encapsulant 310. Insulating layer 320 contains one or more layers of SiO2, Si3N4, SiON, Ta2O5, Al2O3, or other material having similar insulating and structural properties. Insulating layer 320 follows the contour of insulating layer 160 and insulating layer 218. Accordingly, exposed portions of insulating layer 160, insulating layer 218, conductive layer 132, contact pads 214, and encapsulant 310 are covered by insulating layer 320. Insulating layer 320 includes a surface opposite semiconductor die 124 that is substantially flat across reconstituted wafer 296. A portion of insulating layer 320 is removed by LDA, etching, or other suitable process to expose conductive layer 132 and contact pads 214 for subsequent electrical interconnect.

An electrically conductive layer 322 is formed over insulating layer 320 and reconstituted wafer 296 using PVD, CVD, electrolytic plating, electroless plating, or other suitable metal deposition process. Conductive layer 322 contains one or more layers of Al, Cu, Sn, Ni, Au, Ag, or other suitable electrically conductive material. In one embodiment, conductive layer 322 includes an adhesion or seed layer of Ti/Cu, Titanium Tungsten (TiW)/Cu, or a coupling agent/Cu. Another metal with good wet etching selectivity, such as Ni, Au, or Ag, is optionally added to the seed layer. The seed layer is deposited by sputtering, electroless plating, or by depositing laminated Cu foil combined with electroless plating. Conductive layer 322 is electrically connected to conductive layer 132 and contact pads 214. Portions of conductive layer 322 can be electrically common or electrically isolated depending on the design and function of semiconductor die 124 and operate as an RDL to fan-out and extend electrical connection from the semiconductor die.

Figure 5F:
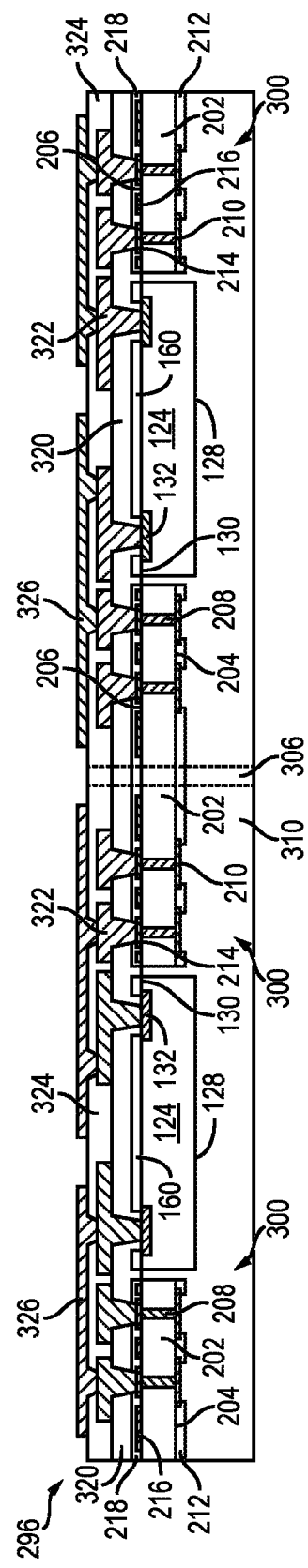

In FIG. 5f, an insulating or passivation layer 324 is formed over insulating layer 320 and conductive layer 322. Insulating layer 324 contains one or more layers of SiO2, Si3N4, SiON, Ta2O5, Al2O3, or other material having similar insulating and structural properties. Insulating layer 324 follows the contour of conductive layer 322. Accordingly, exposed portions of insulating layer 320 and conductive layer 322 are covered by insulating layer 324. Insulating layer 324 includes a surface opposite semiconductor die 124 that is substantially flat across reconstituted wafer 296. A portion of insulating layer 324 is removed by LDA, etching, or other suitable process to expose conductive layer 322 for subsequent electrical interconnect.

An electrically conductive layer 326 is formed over insulating layer 324 and reconstituted wafer 296 using PVD, CVD, electrolytic plating, electroless plating, or other suitable metal deposition process. Conductive layer 326 contains one or more layers of Al, Cu, Sn, Ni, Au, Ag, or other suitable electrically conductive material. In one embodiment, conductive layer 326 includes an adhesion or seed layer of Ti/Cu, TiW/Cu, or a coupling agent/Cu. Another metal with good wet etching selectivity, such as Ni, Au, or Ag, is optionally added to the seed layer. The seed layer is deposited by sputtering, electroless plating, or by depositing laminated Cu foil combined with electroless plating. Conductive layer 326 is electrically connected to conductive layer 132 and contact pads 214 through conductive layer 322. Portions of conductive layer 326 can be electrically common or electrically isolated depending on the design and function of semiconductor die 124 and operate as an RDL to fan-out and extend electrical connection from the semiconductor die.

In FIG. 5g, an insulating or passivation layer 328 is formed over insulating layer 324 and conductive layer 326. Insulating layer 328 contains one or more layers of SiO2, Si3N4, SiON, Ta2O5, Al2O3, or other material having similar insulating and structural properties. Insulating layer 328 follows the contour of conductive layer 326. Accordingly, exposed portions of insulating layer 324 and conductive layer 326 are covered by insulating layer 328. Insulating layer 328 includes a surface opposite semiconductor die 124 that is substantially flat across reconstituted wafer 296. A portion of insulating layer 328 is removed by LDA, etching, or other suitable process to expose conductive layer 326 for subsequent electrical interconnect.

An electrically conductive bump material is deposited over conductive layer 326 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 326 using a suitable attachment or bonding process. In one embodiment, the bump material is reflowed by heating the material above its melting point to form balls or bumps 330. In some applications, bumps 330 are reflowed a second time to improve electrical contact to conductive layer 326. In one embodiment, bumps 330 are formed over an under bump metallization (UBM) layer. Bumps 330 can also be compression bonded or thermocompression bonded to conductive layer 326. Bumps 330 represent one type of interconnect structure that can be formed over conductive layer 326. The interconnect structure can also use bond wires, conductive paste, stud bump, micro bump, or other electrical interconnect.

In FIG. 5h, reconstituted wafer 296 is placed on optional back grinding tape 338 and undergoes a back grinding operation with grinder 340 or other suitable mechanical or etching process to reduce a thickness of the reconstituted wafer and expose semiconductor die 124. The back grinding operation leaves new surface 350 of reconstituted wafer 296 substantially uniform across the entire width of the reconstituted wafer. A portion of encapsulant 310 remains over insulating layer 212 after back grinding. In other embodiments, the back grinding operation exposes insulating layer 212. In some embodiments where a higher quality polishing is required, an additional slurry polishing is performed on surface 350 of reconstituted wafer 296.

In FIG. 5i, an optional backside protection or warpage balance layer 352 is formed over surface 350 of reconstituted wafer 296 using PVD, CVD, printing, lamination, spin coating, spray coating, sintering, or thermal oxidation. Warpage balance layer 352 contains one or more layers of SiO2, Si3N4, SiON, Ta2O5, Al2O3, or other material having similar insulating and structural properties. Warpage balance layer 352 protects semiconductor die 124 and provides a warpage tuning capability for reconstituted wafer 296. In one embodiment, warpage balance layer 352 contains a snap-cure thermoset adhesive. Back grinding tape 338 is removed after formation of warpage balance layer 352.

In FIG. 5j, reconstituted wafer 296 is retaped with supporting tape 358. Openings 360 are formed through warpage balance layer 352 and encapsulant 310 to expose contact pads 210 by LDA using laser 362. In one embodiment, a lower diameter of openings 360 is at least 60 μm larger than contact pads 210, and an upper diameter of openings 360 is greater than the pitch of adjacent contact pads 210. In other embodiments, an upper diameter of openings 360 is less than the pitch of adjacent contact pads 210 such that a portion of warpage balance layer 352 remains between adjacent contact pads 210. After openings 360 are formed, reconstituted wafer 296 undergoes a cleaning process and then an optional Cu organic solderability preservative (OSP) process.

Figure 5K:
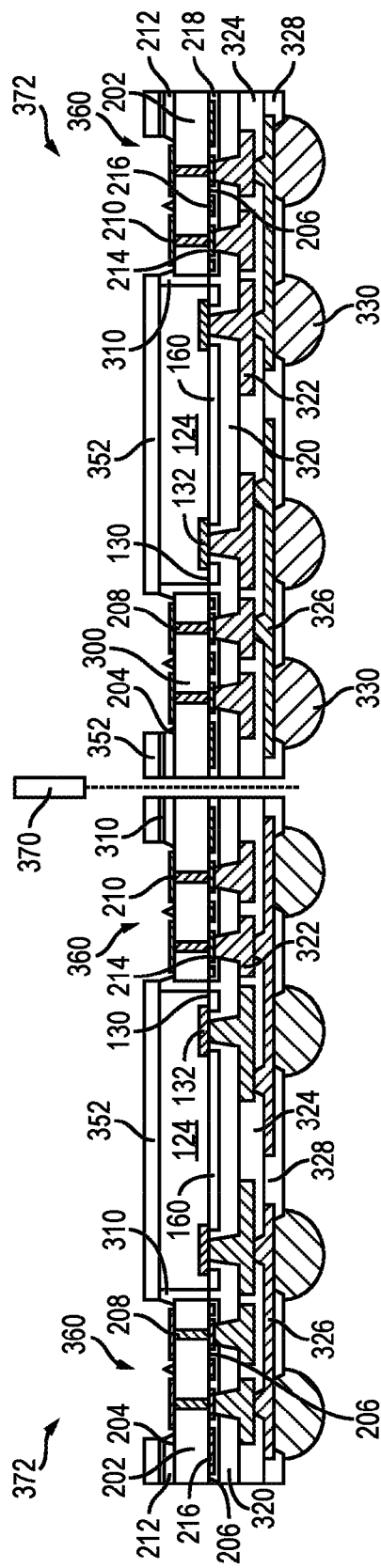
Figure 6:
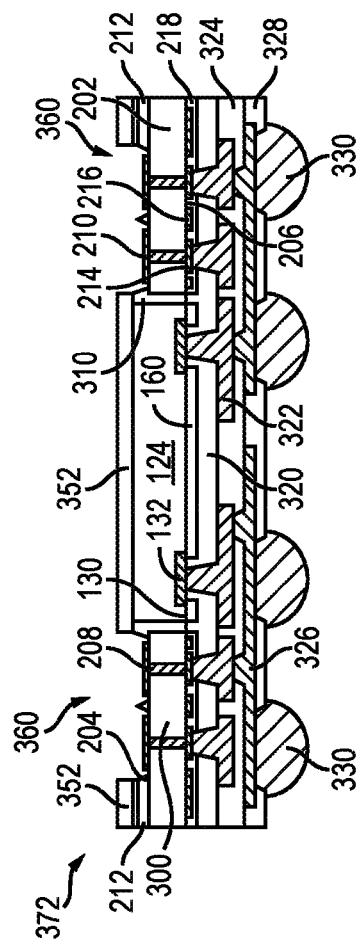
FIG. 6 illustrates a singulated semiconductor package formed in accordance with FIGS. 5a-5k.

In FIG. 5k, supporting tape 358 is removed and semiconductor die 124 are singulated through warpage balance layer 352, encapsulant 310, PCB units 300 and 302, and insulating layers 320, 324, and 328 with saw blade or laser cutting tool 370 into individual packages 372. FIG. 6 shows package 372 after singulation. Semiconductor die 124 is electrically connected to bumps 330 through conductive layers 322 and 326, which operate as an RDL structure to fan-out and extend electrical connection from the semiconductor die. Package 372 is mounted to a substrate or another semiconductor package using bumps 330 for electrical and mechanical connection. A second semiconductor package or other electronic device is mounted to package 372 and electrically connected to semiconductor die 124 and bumps 330 via contact pads 210, vias 208, conductive layer 322, and conductive layer 326. Package 372 includes semiconductor die 124 with half of two different PCB units 300 adjacent to the semiconductor die opposite each other. Half of two different PCB units 302 are in package 372 adjacent to semiconductor die 124, opposite each other, and aligned perpendicular to PCB units 300. In other words, semiconductor die 124 is surrounded by half of two different PCB units 300 and half of two different PCB units 302 which form a rectangle or square around the semiconductor die. PCB units 300 and 302 provide electrical connection around semiconductor die 124 and through package 372. PCB units 300 and 302 include dummy pattern 216 to balance the amount of conductive material on surfaces 204 and 206. With approximately the same surface area covered by conductive material on surfaces 204 and 206, warpage of PCB units 300 and 302 is controlled. Occurrences of mold bleed and flying PCBs are reduced. Therefore, PCB units 300 and 302 remain properly aligned after the compressive molding of encapsulant 310. Conductive layer 322 is able to make proper electrical connection to contact pads 214, and openings 360 properly expose contact pads 210.

Continuing from FIG. 5i, FIG. 7a illustrates an alternative embodiment of forming a semiconductor package including semiconductor die 124 and PCB units 300 and 302. Reconstituted wafer 296 from FIG. 5i is retaped with supporting tape 358. Portions of warpage balance layer 352, encapsulant 310, and insulating layer 212 are removed using a partial grinding or wide-grind dicing process. Contact pads 210 are exposed for subsequent electrical interconnection with another semiconductor package or electronic device. A surface of contact pads 210 is made coplanar with a surface of insulating layer 212. After contact pads 210 are exposed, reconstituted wafer 296 undergoes a cleaning process and then an optional Cu OSP process.

In FIG. 7b, supporting tape 358 is removed and semiconductor die 124 are singulated through PCB units 300 and 302 and insulating layers 320, 324, and 328 with saw blade or laser cutting tool 380 into individual packages 382. FIG. 7c shows package 382 after singulation. Semiconductor die 124 is electrically connected to bumps 330 through conductive layers 322 and 326, which operate as an RDL structure to fan-out and extend electrical connection from the semiconductor die. Package 382 is mounted to a substrate or another semiconductor package using bumps 330 for electrical and mechanical connection. A second semiconductor package or other electronic device is mounted to package 382 and electrically connected to semiconductor die 124 and bumps 330 via contact pads 210, vias 208, conductive layer 322, and conductive layer 326. Package 382 includes semiconductor die 124 with half of two different PCB units 300 adjacent to the semiconductor die opposite each other. Half of two different PCB units 302 are adjacent to semiconductor die 124 opposite each other and aligned perpendicular to PCB units 300. PCB units 300 and 302 provide electrical connection around semiconductor die 124. PCB units 300 and 302 include dummy pattern 216 to balance the amount of conductive material on surfaces 204 and 206. With approximately the same surface area covered by conductive material on surfaces 204 and 206, occurrences of mold bleed and flying PCBs are reduced. PCB units 300 and 302 remain properly aligned after the compressive molding of encapsulant 310, allowing conductive layer 322 to make proper electrical connection to contact pads 214.

FIG. 8a illustrates PCB panel 400. PCB panel 400 is similar to PCB panel 232 in FIG. 3i. Prior to being singulated into individual PCB units or Y-bars 402, through-holes or openings 404 are formed through PCB panel 400 by laser drilling, mechanical drilling, DRIE, or other suitable process. Openings 404 are formed along dicing kerfs or saw streets 406 such that when PCB panel 400 is singulated into individual PCB units 402, each individual opening 404 forms an indentation in the sidewall of two singulated PCB units.

Figure 8B:
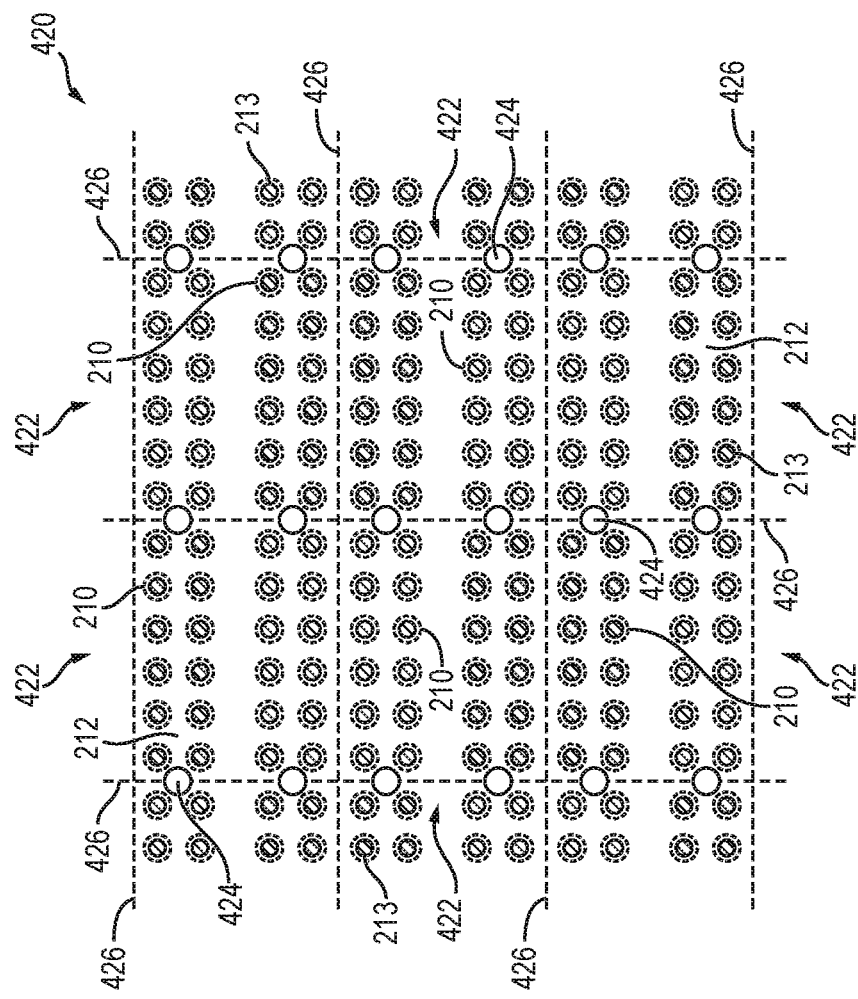

FIG. 8b illustrates PCB panel 420. PCB panel 420 is similar to PCB panel 400. Prior to being singulated into individual PCB units or X-bars 422, through-holes or openings 424 are formed through PCB panel 420 using laser drilling, mechanical drilling, DRIE, or another suitable process. Openings 424 are formed along dicing kerfs or saw streets 426 such that when PCB panel 420 is singulated into individual PCB units 422, each individual opening 424 forms an indentation in the sidewall of two singulated PCB units.

Figure 8C:
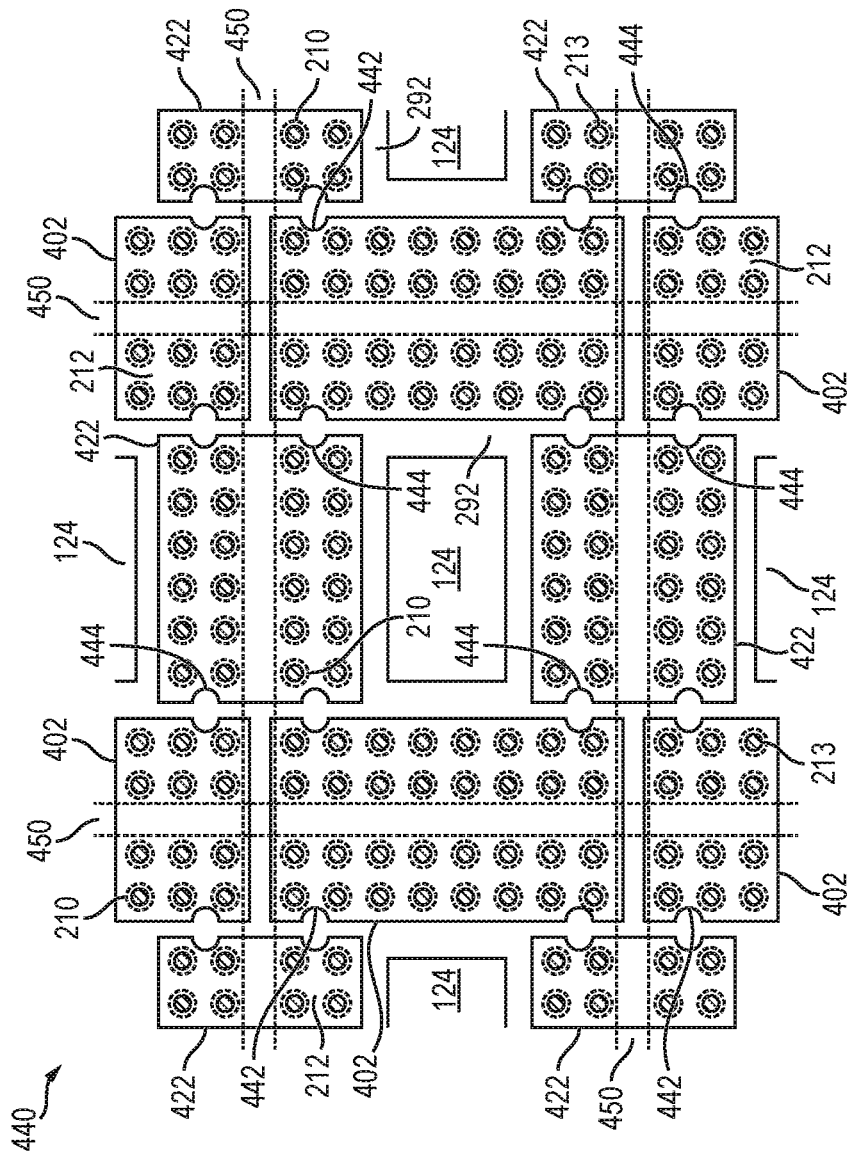

FIG. 8c illustrates reconstituted wafer 440. Reconstituted wafer 440 is similar to reconstituted wafer 296 in FIG. 5b. PCB units 402 include indentations 442 formed by singulating PCB panel 400 through openings 404. PCB units 422 include indentations 444 formed by singulating PCB panel 420 through openings 424. Reconstituted wafer 440 is laid out in plan view such that each indentation 442 of a PCB unit 402 is adjacent to and faces an indentation 444 of a PCB unit 422. Indentations 442 and 444 improve the adhesion of PCB units 402 and 422 to an encapsulant which is subsequently formed over reconstituted wafer 440 similarly to encapsulant 310 in FIG. 5c. Indentations 442 and 444 are filled with encapsulant. The encapsulant disposed in indentations 442 and 444 is cured and becomes hard, providing added strength to hold PCB units 402 and 422 in place in reconstituted wafer 440. Indentations 442 and 444 also help release the stress concentration at the areas between adjacent PCB units 402 and 422. Reconstituted wafer 440 undergoes a process of forming semiconductor packages similar to the process illustrated in FIGS. 5c-5k and 6. Semiconductor die 124 are singulated through saw streets 450 to create individual semiconductor packages.

Figure 8D:
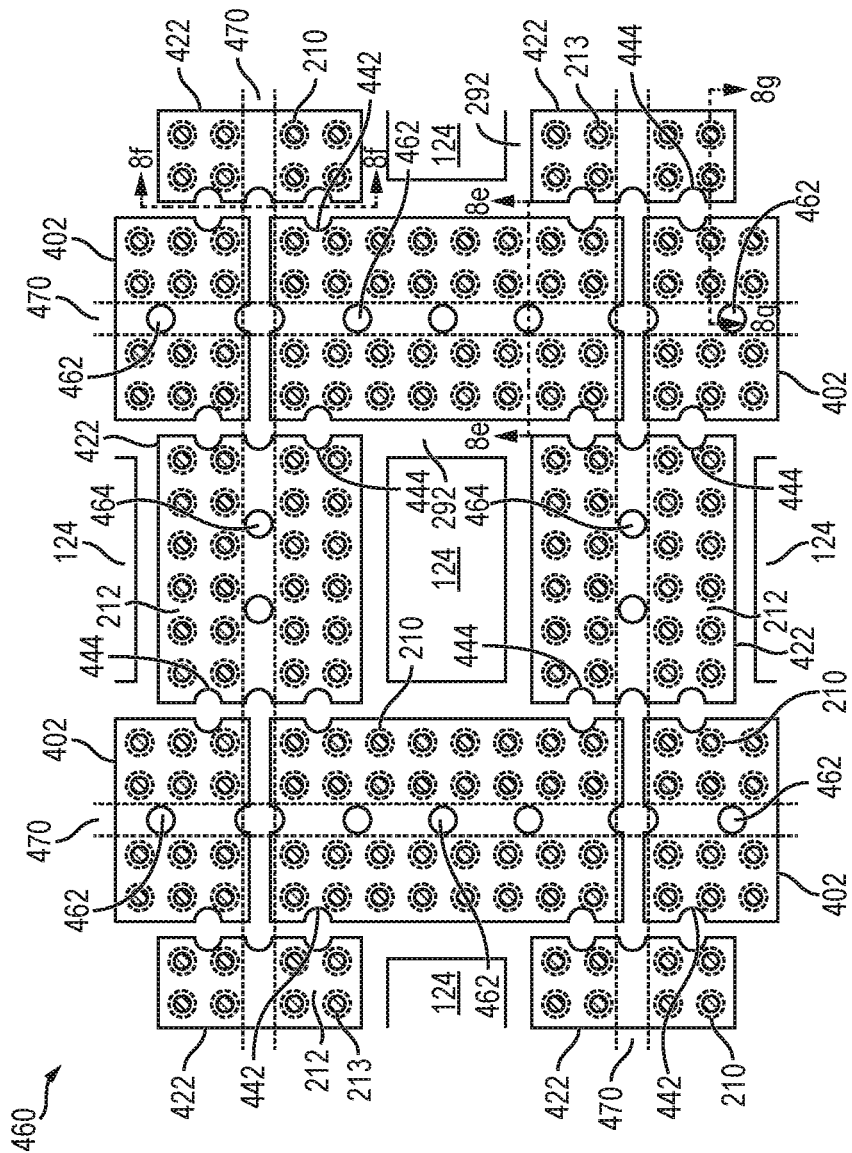

FIG. 8d illustrates reconstituted wafer 460. Reconstituted wafer 460 is similar to reconstituted wafer 440 in FIG. 8c. PCB units 402 include indentations 442 formed by singulating PCB panel 400 through openings 404. PCB units 402 also include through-holes or openings 462 which are formed using laser drilling, mechanical drilling, DRIE, or other suitable process prior to singulating PCB panel 400 into individual PCB units. Some openings 462 are formed on saw streets 406 such that when PCB panel 400 is singulated, the openings 462 form indentations in a sidewall of an individual PCB unit 402 similar to indentations 442. PCB units 422 include indentations 444 formed by singulating PCB panel 420 through openings 424. PCB units 422 also include through-holes or openings 464 which are formed using laser drilling, mechanical drilling, DRIE, or other suitable process prior to singulating PCB panel 420. Some openings 464 are formed on saw streets 426 such that when PCB panel 420 is singulated the openings 464 form indentations in a sidewall of an individual PCB unit 422 similar to indentations 444.

Reconstituted wafer 460 is laid out in plan view such that each indentation 442 of a PCB unit 402 is adjacent to and faces an indentation 444 of a PCB unit 422. Indentations 442, indentations 444, openings 462, and openings 464 improve the adhesion of PCB units 402 and 422 to an encapsulant which is subsequently formed over reconstituted wafer 440 similarly to encapsulant 310 in FIG. 5c. Indentations 442, indentations 444, openings 462, and openings 464 fill with encapsulant, which is cured and becomes hard. The cured encapsulant disposed in openings 462 and 464 provides added strength to hold PCB units 402 and 422 in place in reconstituted wafer 460. Indentations 442 and 444 also help release the stress concentration at the areas between adjacent PCB units 402 and 422.

Figure 8E:
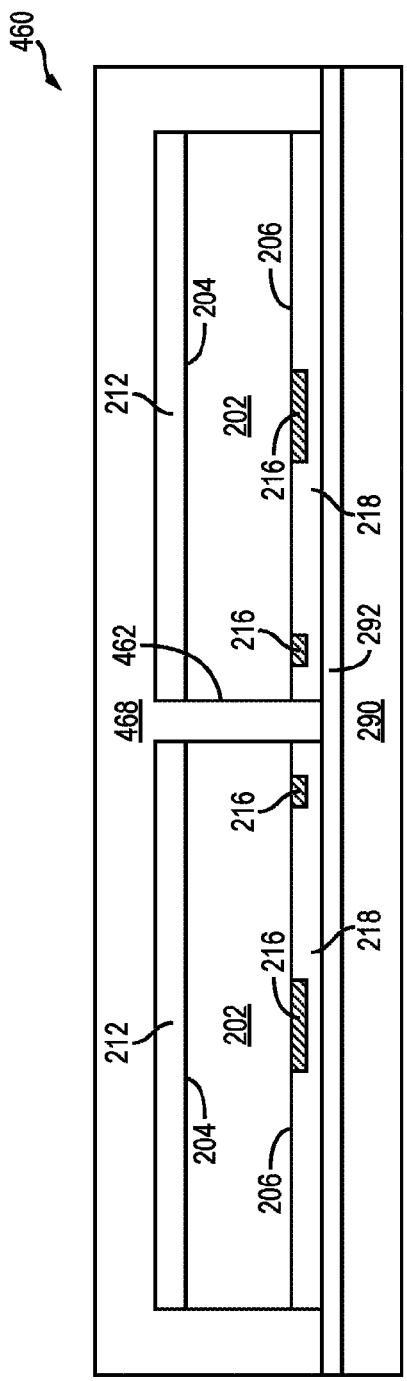

FIG. 8e illustrates opening 462 after encapsulant 468 is deposited over reconstituted wafer 460. Encapsulant 468 fills opening 462 and provides support to hold PCB unit 402 in place in reconstituted wafer 460. When reconstituted wafer 460 is singulated into individual semiconductor packages through saw streets 470, a portion of the encapsulant in opening 462 remains with each of the singulated semiconductor packages and continues to hold PCB unit 402 in place in the semiconductor packages. Openings 464 operate in the same manner as openings 462.

Figure 8F:
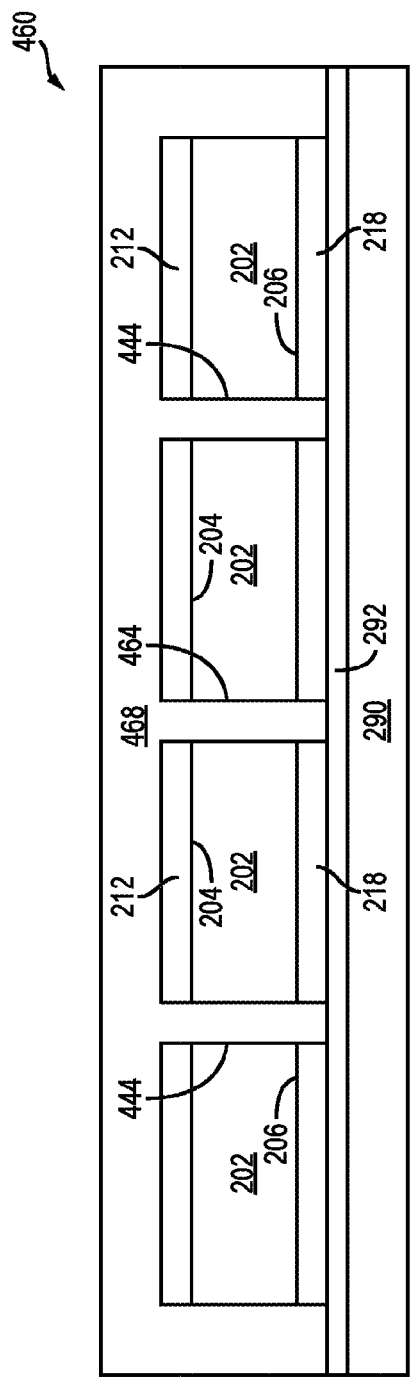

FIG. 8f illustrates a side view of PCB unit 422 with indentations 444 and 464 filled with encapsulant 468. Encapsulant 468 fills indentations 444 and 464, providing support to hold PCB unit 422 in place in reconstituted wafer 460. Indentations 442 and 462 operate in the same manner as indentations 444 and 464.

Figure 8G:
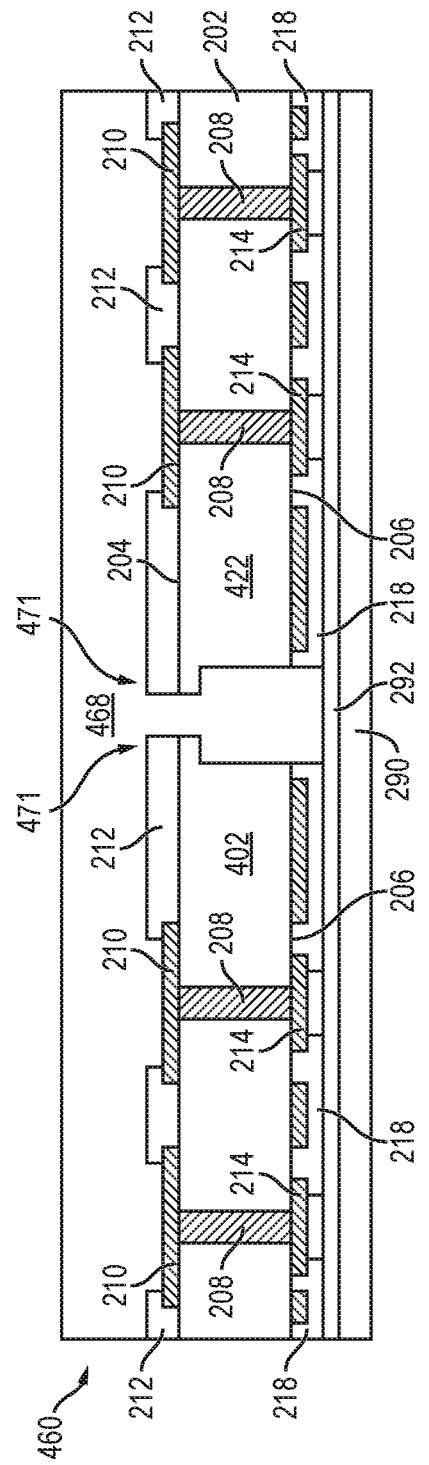

FIG. 8g illustrates an alternative embodiment for singulating PCB panels 400 into individual PCB units 402. A step-cut is used to singulate PCB panel 400. PCB panel 400 is singulated through surface 206 using a wider blade than is used to singulate through surface 204. A lip or flange 471 is created around the perimeter of PCB units 402. Flange 471 is embedded in encapsulant 468 as a part of reconstituted wafer 460. Flange 471 embedded in encapsulant 468 helps hold PCB units 402 in place. Flange 471 extends surface 204 such that surface 204 has a width that is greater than a width of surface 206. Surface 204 has a larger surface area than surface 206. The embodiment of FIG. 8g, with flange 471, is particularly useful in designs where PCB unit 402 includes a pitch of vias 208 which is less than or equal to 0.35 mm.

Reconstituted wafer 460 undergoes a process of forming semiconductor packages similar to the process illustrated in FIGS. 5c-5k and 6.

Figure 8H:
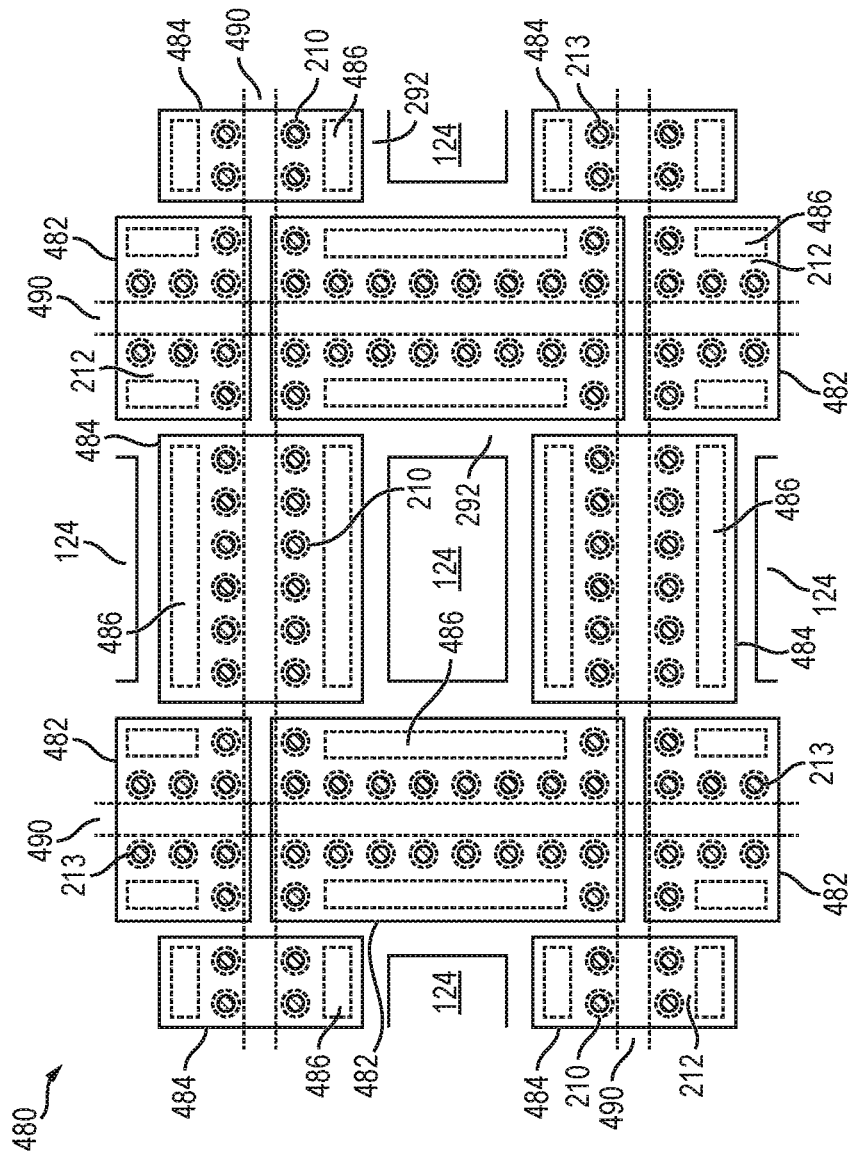

FIG. 8h illustrates reconstituted wafer 480. Reconstituted wafer 480 is similar to reconstituted wafer 296 in FIG. 5b, but vias 208, contact pads 210, and contact pads 214 are formed in a different pattern. PCB units 482 and 484 are formed such that when the PCB units are placed adjacent to semiconductor die 124, a dummy PCB area 486 of each PCB unit is disposed near the semiconductor die. Dummy PCB areas 486 are areas of a PCB unit formed without vias 208, conductive pads 210, or conductive pads 214. The pattern of dummy areas 486 is designed to control warpage of reconstituted wafer 480. In one embodiment, dummy PCB area 486 is used when the area of semiconductor die 124 is greater than or equal to 70% of the total area of a final semiconductor package formed with semiconductor die 124 and PCB units 482 and 484. The size and shape of dummy PCB areas 486 is adjusted as necessary to tune the warpage of reconstituted wafer 480. Reconstituted wafer 480 undergoes a process of forming semiconductor packages similar to the process illustrated in FIGS. 5c-5k and 6. Semiconductor die 124 are singulated through saw streets 490 to create individual semiconductor packages.

Figure 8I:
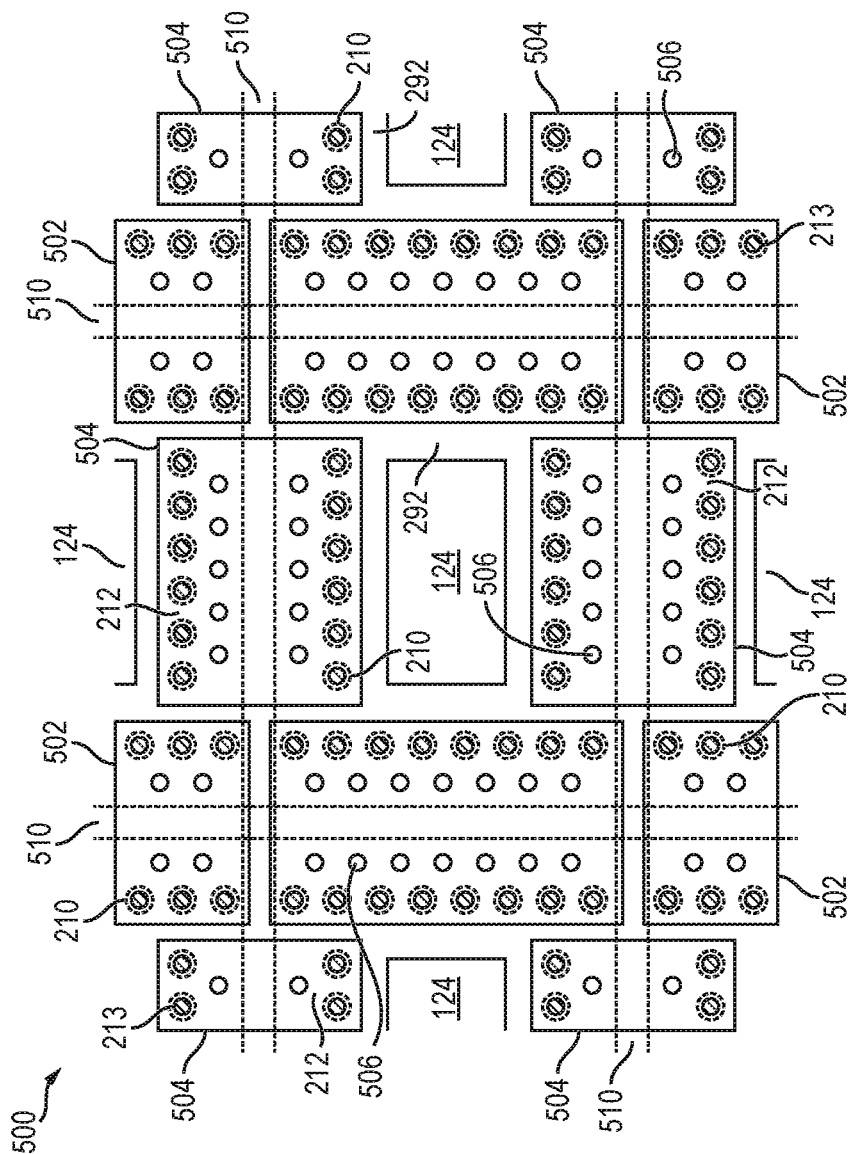

FIG. 8i illustrates reconstituted wafer 500. Reconstituted wafer 500 is similar to reconstituted wafer 296 in FIG. 5b, but with fewer rows of vias 208 formed at the center of PCB units 502 and 504 as compared to PCB units 300 and 302. PCB units 502 and 504 include rows of through-holes or openings 506 running along a center portion of PCB units 502 and 504 adjacent to saw streets 510 of reconstituted wafer 500. Openings 506 are formed using laser drilling, mechanical drilling, DRIE, or other suitable process and are filled with encapsulant during a subsequent processing step, similar to that shown in FIG. 5c. The encapsulant deposited into openings 506 provides added strength for holding PCB units 502 and 504 in place. Reconstituted wafer 500 undergoes a process of forming semiconductor packages similar to the process illustrated in FIGS. 5c-5k and 6. Semiconductor die 124 are singulated through saw streets 510 to create individual semiconductor packages.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a plurality of first contact pads over a first surface of the substrate;
   forming a plurality of second contact pads over a second surface of the substrate;
   forming a dummy pattern over the second surface of the substrate, wherein an area of the first surface covered by the first contact pads is approximately equal to an area of the second surface covered by the second contact pads plus an area of the second surface covered by the dummy pattern;
   forming a second insulating layer over the second contact pads and dummy pattern;
   forming an opening through the substrate;
   disposing the substrate on a carrier with the second surface of the substrate oriented toward the carrier;
   disposing a first semiconductor die on the carrier outside a footprint of the substrate;
   disposing a second semiconductor die on the carrier outside the footprint of the substrate opposite the first semiconductor die;
   depositing an encapsulant over the first semiconductor die, second semiconductor die, and substrate, wherein the encapsulant fills the opening;
   forming a build-up interconnect structure over the encapsulant and the second surface of the substrate, wherein the second insulating layer completely covers the dummy pattern under the build-up interconnect structure; and
   singulating through the opening, encapsulant, and build-up interconnect structure to separate the first semiconductor die from the second semiconductor die.

2. The method of claim 1, further including:
   forming a first indentation in a sidewall of the substrate;
   providing a second substrate;
   forming a second indentation in a sidewall of the second substrate;
   disposing the substrate and the second substrate on the carrier with the first indentation and second indentation aligned with each other;
   depositing the encapsulant extending into the first indentation and second indentation; and
   singulating through the first indentation and second indentation.

3. The method of claim 1, further including:
   forming a first insulating layer over the first surface of the substrate;
   forming a plurality of first openings in the first insulating layer over the first contact pads;
   forming a plurality of second openings in the second insulating layer over the second contact pads; and
   forming a plurality of dummy openings in the second insulating layer with the second surface of the substrate exposed in the dummy openings, wherein a surface area of the dummy openings and second openings in combination is approximately equal to a surface area of the first openings.

4. A method of making a semiconductor device, comprising:
   providing a substrate;
   forming a first conductive layer covering a first surface area of a first surface of the substrate;
   forming a second conductive layer covering a second surface area of a second surface of the substrate, wherein the first surface area is larger than the second surface area;
   forming a dummy pattern over the second surface of the substrate, wherein a third surface area of the dummy pattern is approximately equal to a difference between the first surface area of the first conductive layer and the second surface area of the second conductive layer;
   forming an opening through the substrate; and
   singulating the substrate through the opening.

5. The method of claim 4, further including forming an indentation in a sidewall of the substrate.

6. The method of claim 4, further including depositing an encapsulant in the opening of the substrate.

7. The method of claim 4, further including:
   forming an insulating layer over the second surface of the substrate; and
   forming a dummy opening in the insulating layer.

8. The method of claim 4, further including:
   cutting through the first surface of the substrate with a first blade having a first width; and
   cutting through the second surface of the substrate with a second blade having a second width, wherein the difference between the first width and second width leaves a lip around a perimeter of the first surface of the substrate.

9. The method of claim 4, further including:
   disposing a semiconductor die adjacent to the substrate; and
   depositing an encapsulant over the semiconductor die and substrate.

10. The method of claim 5, further including singulating the substrate through the indentation.

11. The method of claim 9, further including singulating through the opening prior to depositing the encapsulant.

12. The method of claim 9, further including singulating through the opening after depositing the encapsulant.

13. A method of making a semiconductor device, comprising:
    providing a substrate;
    forming a plurality of first contact pads over a first surface of the substrate;
    forming a plurality of second contact pads over a second surface of the substrate;
    forming a dummy pattern over the second surface of the substrate, wherein a surface area of the dummy pattern is determined by a difference between a surface area of the first contact pads and the surface area of the second contact pads;
    forming an opening through the substrate; and
    singulating the substrate through the opening.

14. The method of claim 13, further including forming an indentation in a sidewall of the substrate.

15. The method of claim 13, further including depositing an encapsulant in the opening of the substrate.

16. The method of claim 13, further including:
    forming a first insulating layer over the first surface of the substrate;
    forming a second insulating layer over the second surface of the substrate; and
    forming a dummy opening in the second insulating layer to balance the second insulating layer and first insulating layer.

17. The method of claim 13, wherein the first surface of the substrate includes a width that is greater than a width of the second surface of the substrate.

\* \* \* \* \*